(12) United States Patent
Shukuri et al.

(10) Patent No.: US 7,463,517 B2
(45) Date of Patent: *Dec. 9, 2008

(54) SEMICONDUCTOR INTEGRATED CIRCUIT AND NONVOLATILE MEMORY ELEMENT

(75) Inventors: Shoji Shukuri, Koganei (JP); Kazuhiro Komori, Musashimurayama (JP); Katsuhiko Kubota, Higashiyamato (JP); Kousuke Okuyama, Kawagoe (JP)

(73) Assignee: Renesas Technology Corp., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 11/869,564

(22) Filed: Oct. 9, 2007

(65) Prior Publication Data

US 2008/0037323 A1    Feb. 14, 2008

Related U.S. Application Data

(63) Continuation of application No. 11/432,507, filed on May 12, 2006, now Pat. No. 7,289,361, which is a continuation of application No. 11/430,039, filed on May 9, 2006, which is a continuation of application No. 11/151,231, filed on Jun. 14, 2005, now Pat. No. 7,042,764, which is a continuation of application No. 10/817,820, filed on Apr. 6, 2004, now Pat. No. 6,906,954, which is a continuation of application No. 10/610,567, filed on Jul. 2, 2003, now Pat. No. 6,771,538, which is a continuation of application No. 09/493,280, filed on Jan. 28, 2000, now Pat. No. 6,614,684.

(30) Foreign Application Priority Data

Feb. 1, 1999 (JP) .................................. 11-023631

(51) Int. Cl.
*G11C 16/04* (2006.01)
*G11C 14/00* (2006.01)

(52) U.S. Cl. .............................. 365/185.04; 365/185.05; 365/185.08; 257/314; 257/318

(58) Field of Classification Search ............ 365/185.03, 365/185.04, 185.05, 185.08, 185.26, 185.33; 257/314, 318

See application file for complete search history.

(56) References Cited

U.S. PATENT DOCUMENTS 4,040,015 A    8/1977    Fukuda (Continued)

FOREIGN PATENT DOCUMENTS

EP    0 448 118 A2    9/1991

(Continued)

OTHER PUBLICATIONS

Ohsaki, K. et al; "SIPPOS (Single Poly Pure CMOS) EEPROM Embedded FPGA by News Ring Interconnection and Highway Path," Advanced System Development, Component Technology, IBM Japan. IEEE 1994 Custom Integrated Circuits Conference, (pp. 189-192).

*Primary Examiner*—Trong Phan
(74) *Attorney, Agent, or Firm*—Antonelli, Terry, Stout & Kraus, LLP.

(57) ABSTRACT

A semiconductor integrated circuit device is provided on a semiconductor substrate, and includes a plurality of word lines, a plurality of data lines, and a plurality of electrically programmable and erasable non-volatile memory cells respectively coupled to the plurality of word lines and to the plurality of data lines. The erasable non-volatile memory cell each includes a MIS transistor having a floating gate having a first level polycrystalline silicon layer, a source, and a drain coupled to the corresponding data line, and a control gate formed of a semiconductor region in the semiconductor substrate, the control gate being coupled to the corresponding word line.

4 Claims, 27 Drawing Sheets

U.S. PATENT DOCUMENTS

| | | |
|---|---|---|
| 4,279,069 A | 7/1981 | Beguwala et al. |
| 4,393,474 A | 7/1983 | McElroy et al. |
| 5,237,530 A | 8/1993 | Takashina et al. |
| 5,339,279 A | 8/1994 | Toms et al. |
| 5,465,231 A | 11/1995 | Ohsaki |
| 5,497,475 A | 3/1996 | Alapat |
| 5,694,357 A | 12/1997 | Mori |
| 5,719,427 A | 2/1998 | Tong et al. |
| 5,761,126 A | 6/1998 | Chi et al. |
| 5,828,599 A | 10/1998 | Herdt |
| 5,872,994 A | 2/1999 | Akiyama et al. |
| 5,937,424 A | 8/1999 | Leak et al. |
| 5,995,409 A | 11/1999 | Holland |
| 5,999,446 A | 12/1999 | Harari et al. |
| 6,026,016 A | 2/2000 | Gafken |
| 6,131,139 A | 10/2000 | Kikuchi et al. |
| 6,141,256 A | 10/2000 | Forbes |
| 6,181,603 B1 | 1/2001 | Jyouno et al. |
| 6,198,663 B1 | 3/2001 | Takizawa |
| 6,201,733 B1 | 3/2001 | Hiraki et al. |
| 6,229,737 B1 | 5/2001 | Walukas |

FOREIGN PATENT DOCUMENTS

| | | |
|---|---|---|
| EP | 0448118 A2 | 9/1991 |
| EP | A-0470371 | 2/1992 |
| EP | 0 828 252 A2 | 3/1998 |
| EP | 0828252 A2 | 3/1998 |
| EP | A-0881571 | 12/1998 |
| JP | 263999 | 10/1989 |
| JP | 74392 | 3/1992 |
| JP | 127478 | 4/1992 |
| JP | 129091 | 4/1992 |
| JP | 163797 | 6/1992 |
| JP | 268180 | 9/1994 |
| WO | WO 94/18676 | 8/1994 |
| WO | WO 98/19343 | 5/1998 |

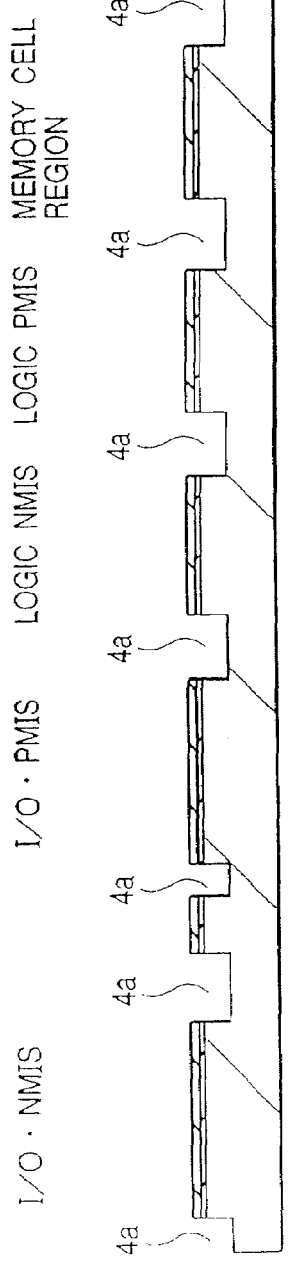
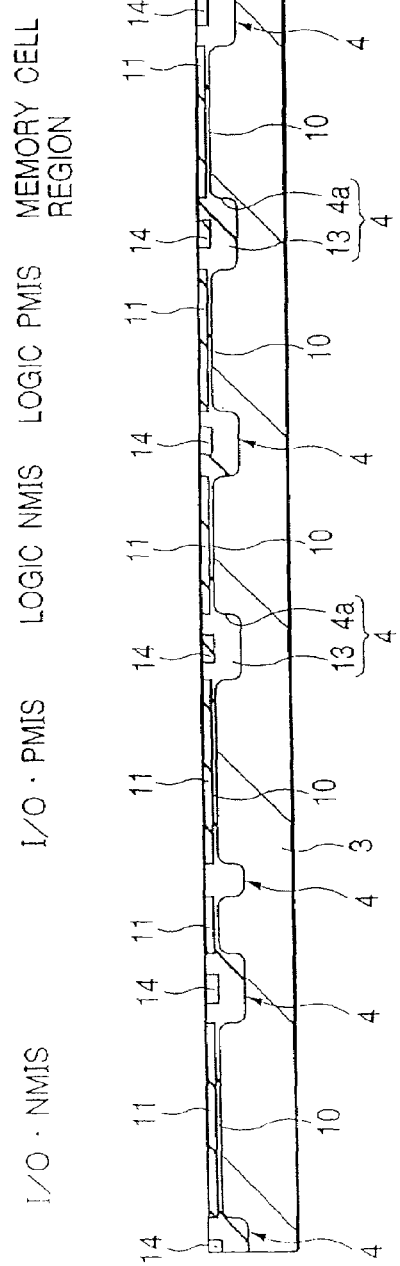

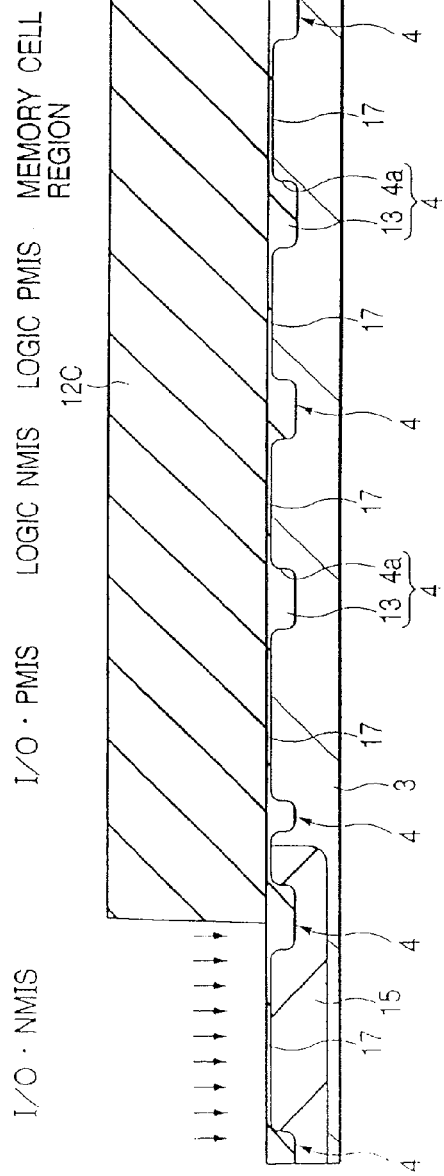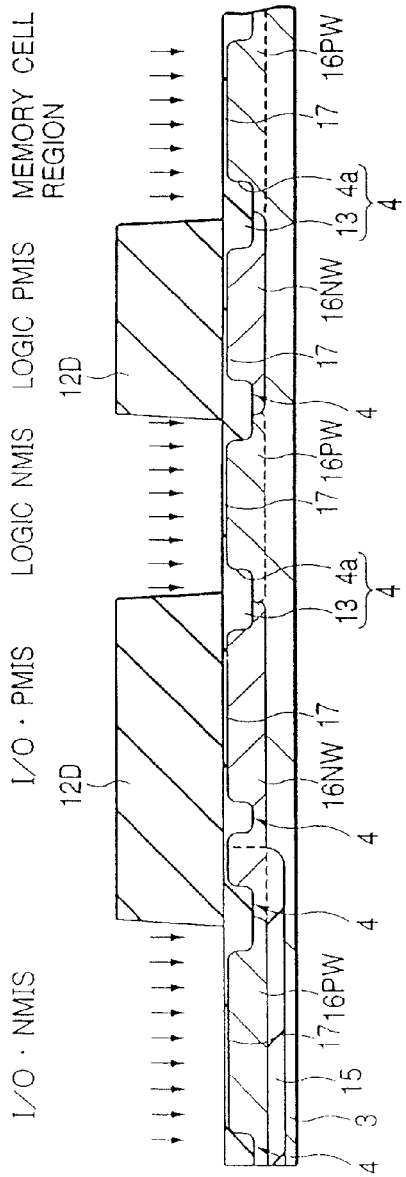

SEMICONDUCTOR INTEGRATED CIRCUIT AND NONVOLATILE MEMORY ELEMENT

CROSS-REFERENCE TO RELATED APPLICATIONS

This application is a continuation of Ser. No. 11/430,039, filed May 9, 2006 and also a continuation of Ser. No. 11/432, 507, filed May 12, 2006 (now U.S. Pat. No. 7,289,361), which, in turn is a continuation of Ser. No. 11/151,231, filed Jun. 14, 2005 (now U.S. Pat. No. 7,042,764), which, in turn, is a continuation of Ser. No. 10/817,820, filed Apr. 6, 2004 (now U.S. Pat. No. 6,906,954), which, in turn is a continuation of Ser. No. 10/610,567 filed on Jul. 2, 2003 (now U.S. Pat. No. 6,771,538), which, in turn, is a continuation of Ser. No. 09/493,280 filed on Jan. 28, 2000 (now U.S. Pat. No. 6,614, 684), and which applications claim priority from Japanese patent Application No. JP 11-023631, filed Feb. 1, 1999, the entire contents of which are hereby incorporated herein by reference in their entirety.

BACKGROUND OF THE INVENTION

The present invention relates to a semiconductor integrated circuit having electrically erasable and programmable nonvolatile memory elements. More particularly, the invention relates, for example, to techniques which are effective when applied to a semiconductor integrated circuit having a nonvolatile memory wherein two nonvolatile memory elements are used as a storage unit.

In recent years, as a memory device in which data or program-constituting data are stored, substantial public attention has been directed to a flash EEPROM (hereinbelow, termed "flash memory"), which is a nonvolatile storage device from/into which stored data/data to be stored are electrically erasable/programmable collectively in predetermined units. The flash memory has its memory cells configured of electrically erasable and programmable nonvolatile memory elements, and it is capable of erasing data or program-constituting data once written into the memory cells and rewriting (programming) new data or program-constituting data into the memory cells.

Therefore, for the purpose of, e.g., altering data, correcting the bugs of a program or updating a program after a flash memory or a macrocomputer having a built-in flash memory has been assembled into an application system, data or data constituting the program as stored in the flash memory can be altered, so that the term necessary for the development of the application system can be shortened, and so that the flexibility of the development of the program of the application system is enhanced.

On the other hand, in recent years, note has also been taken of a system semiconductor device (hereinbelow, also termed "system LSI") wherein one system can be constructed of a single semiconductor integrated circuit device by forming on a single semiconductor substrate a central processing unit (hereinbelow, also termed "CPU") as a data control device, a dynamic random access memory (hereinbelow, also termed "DRAM") as a large-scale storage device, a static random access memory (hereinbelow, also termed "SRAM") as a high-speed storage device or cache memory, and other functional circuits. Such a system LSI is effective for reducing the size of a printed circuit board or packaging circuit board, etc., and especially for reducing the size and lightening the weight of a portable telephone set, a portable data terminal, and similar portable equipment.

Incidentally, after the completion of the present invention, the inventors investigated into known examples from a viewpoint-A and a viewpoint-B, as stated below.

The viewpoint-A concerns the use of a polysilicon gate of single layer for forming the memory cell of a nonvolatile memory, while the viewpoint-B concerns the use of two memory cells in a differential fashion.

As a result, regarding the viewpoint-A, there have been found the official gazette of U.S. Pat. No. 5,440,159, the official gazette of U.S. Pat. No. 5,504,706, the official gazette of Japanese Patent Application Laid-open No. 212471/1992 (the official gazette of corresponding U.S. Pat. No. 5,457, 335), and Oosaki et al., "A single Ploy EEPROM Cell Structure for Use in Standard CMOS Processes", IEEE Journal of solid sate circuits", VOL. 29, NO. 3, March 1994, pp 311-316.

On the other hand, regarding the viewpoint-B, there have been found the official gazettes of Japanese Patent Applications Laid-open No. 163797/1992, No. 263999/1989, No. 74392/1992, No. 127478/1992, No. 129091/1992 and No. 268180/1994, and the official gazette of U.S. Pat. No. 5,029, 131.

By the way, the official gazette of Japanese Patent Application Laid-open No. 212471/1992 discloses also a technique which utilizes an electrically programmable nonvolatile memory (EPROM) as a remedy circuit for a read only memory (ROM). Further, the official gazette contains the statement that the nonvolatile memory element of single-layer gate structure according to this invention can be utilized also as an electrically programmable and erasable nonvolatile memory element which executes programming with hot carriers and executes erasing with a tunneling current by applying a high voltage to a source or a drain, or which executes programming and erasing with tunneling currents.

SUMMARY OF THE INVENTION

The documents found by the investigation into the known examples have not disclosed at all the possibility that nonvolatile memory cells, each employing a single polysilicon layer may be utilized in a differential form, a discussion concerning the relationship between the initial threshold voltage of the memory cells (the threshold voltage in a thermal equilibrium state) and a word line potential in a data readout mode, in the case where the nonvolatile memory cells each employing the single polysilicon layer are utilized in the differential form, and so forth.

In addition, the following facts have been revealed by the inventors.

It has been found by the inventors that even a memory cell structure in the differential form has a first problem in that the occurring rate of readout faults ascribable to the deterioration of charge retention characteristics are greatly affected by the states of an initial threshold voltage under which no charge exists in a floating gate, threshold voltages in write and erase states, and a word line potential in a readout operation. Incidentally, FIGS. 12 and 13 to be referred to below do not belong to known techniques, but they are drawings created by the inventors in order to facilitate the understanding of the present invention.

FIG. 12 shows the threshold voltage distribution of memory cells in the case where the initial threshold voltage (Vthi) is set comparatively high. By way of example, the initial threshold voltage (Vthi) is set higher than the average value between a low threshold voltage (VthL) as in the erase state and a high threshold voltage (VthH) as in the write state. The readout word line potential (Vread) is set in the medium range between the low threshold voltage (VthL) and the initial threshold voltage (Vthi). In the set state, the voltage difference between the initial threshold voltage (Vthi) and the high threshold voltage (VthH) under which electrons are accumulated in the floating gate is small. That is, the quantity of accumulated charges is small, and a retaining field strength which is applied to a tunnel oxide film in a retention state is low. As a result, the fall of the threshold voltage attributed to charge leakage from the floating gate is difficult to develop. On the other hand, an electric field in the direction of injecting electrons into the floating gate is applied to the tunnel oxide film of the memory cell of the low threshold voltage (VthL) by the word line voltage in the readout operation, so that the rise of the threshold voltage or a so-called "charge gain" develops. On this occasion, the undesirable rise of the threshold voltage mounts up to the initial threshold voltage (Vthi), so that when the threshold voltage has become higher than the readout word line potential (Vread), data is inverted so as to produce a readout fault. It has accordingly been revealed by the inventors that the characteristics as shown in FIG. 12 are comparatively good at the data retention, but that they are less immune against the charge gain.

Contrariwise to the above, FIG. 13 shows the threshold voltage distribution of memory cells in the case where the initial threshold voltage (Vthi) is set comparatively low. By way of example, the initial threshold voltage (Vthi) is set lower than the average value between the low threshold voltage (VthL) and the high threshold voltage (VthH). The readout word line potential (Vread) is set in the medium range between the low threshold voltage (VthL) and the initial threshold voltage (Vthi). In the set state, the voltage difference between the initial threshold voltage (Vthi) and the low threshold voltage (VthL) under which electrons are not accumulated in the floating gate is small, and the charge gain based on the word line voltage in the readout operation is difficult to occur. On the other hand, the memory cell of the high threshold voltage (VthH) has a large voltage difference from the initial threshold voltage (Vthi), so that the quantity of accumulated charges is large, and so that the retaining field strength which is applied to the tunnel oxide film in the retention state is high. As a result, the undesirable fall of the threshold voltage attributed to the charge leakage from the floating gate is liable to develop. On this occasion, the undesirable fall of the threshold voltage mounts up to the initial threshold voltage (Vthi), so that when the threshold voltage has become lower than the readout word line potential (Vread), data is inverted so as to produce a readout fault. It has been found by the inventors that the characteristics as shown in FIG. 13 are immune against the charge gain and can produce a comparatively large readout current owing to the large difference between the low threshold voltage (VthL) and the readout word line potential (Vread), but that they are not good at the data retention.

As a second problem, there is also the problem that, with memory cells of a floating gate/control gate vertically-stacking structure, namely, memory cells of the stacked gate type, the manufacturing cost thereof increases due to the complicated memory cell structure. Especially in a so-called "system LSI (Large Scale Integration)" product in which a flash memory is merged with a high-speed logic circuit, a DRAM (Dynamic Random Access Memory), or the like, which whose market is rapidly expanding in recent years, an increase of the manufacturing cost thereof to adopt the stacked gate type memory cells are adopted for the flash memory. According to the inventors' study, this is caused by increases in the numbers of photo-masks and manufacturing steps as will be explained below. Since the tunnel oxide films of the flash memory are thicker than the gate oxide films of transistors for the logic circuit or the gate oxide films of the transistors of DRAM cells, there are required a mask for separately forming the tunnel oxide films, a mask for adding and working polysilicon films for the floating gates of the flash memory, a mask for working the word lines of the flash memory, an impurity implanting mask for forming the drain regions of the flash memory, and impurity implanting masks for forming the low-concentration N-type source and drain regions and low-concentration P-type source and drain regions of high-withstand-voltage transistors constituting write and erase circuits, and the number of the masks to be added becomes, at least, six. It is therefore difficult to provide an inexpensive system LSI for civilian goods in which a flash memory employing stacked gate type memory cells is packaged. In order to overcome this difficulty, nonvolatile memory elements of single-layer polysilicon gate structure may be formed.

It is necessary, however, to also consider the relationship of the thickness of the gate oxide films of the nonvolatile memory elements of the single-layer polysilicon gate structure with the thickness of the gate oxide films of the MIS transistors of any other circuit which is packaged together with the nonvolatile, memory elements. According to the inventors' study, the limit of the number of times of rewriting the nonvolatile memory element correlates with the thickness of the gate oxide film, and so the gate oxide film preferably should be thickened in order to moderate the rate of the deterioration of the information retention capability of the element. In order to avoid complicating the manufacturing process of a semiconductor integrated circuit, however, it is considered desirable to make the thickness of the gate oxide film in the nonvolatile memory element of the single-layer gate structure common with that of the gate oxide film of the MIS transistor of the other circuit.

An object of the present invention is to provide a semiconductor integrated circuit which can remarkably enhance a long-term information retention capability based on a memory cell including a pair of nonvolatile memory elements in a differential form.

Another object of the present invention is to simplify the device structure of a semiconductor integrated circuit in which an electrically programmable nonvolatile memory is merged and packaged.

Still another object of the present invention is to provide a semiconductor integrated circuit in which a nonvolatile memory is packaged, the nonvolatile memory being in a 2-cells/1-bit differential form adapted to conspicuously lower the rate of occurrence of readout faults without adding any new process to ordinary logic circuit processes or general DRAM processes.

Yet another object of the present invention is to provide a technique according to which flash memory cells each including a single-layer polysilicon gate are utilized as a remedy circuit for a memory module or a memory circuit formed in a semiconductor device.

The above and other objects and novel features of the present invention will become apparent from the description provided in this specification and the accompanying drawings.

Typical aspects of invention disclosed in the present application will be briefly summarized below.

[1] A first feature of the invention consists of the fact that the differential connection form of nonvolatile memory elements is adopted for the memory cell of a nonvolatile memory, and that the initial threshold voltage of the nonvolatile memory elements is determined considering the operating point of a sense amplifier and a selection voltage for a word line. More specifically, with regard to a semiconductor integrated circuit including a nonvolatile memory (113, 114 or 115) which comprises a nonvolatile memory cell (131) including a pair of nonvolatile memory elements (130) each having a source (ST3), a drain (DT3), a floating gate (FGT) and a control gate (CGT), the pair of control gates sharing a word line (WL), the pair of drains being respectively coupled to a pair of complementary data lines (DLt and DLb), and in which information items read out on said pair of complementary data lines in accordance with mutually different logical states or different threshold voltage states of said pair of nonvolatile memory elements are differentially amplified by a sense amplifier (143); a selection voltage (Vread) which is applied to said word line for the purpose of the information readout from said nonvolatile memory elements and an initial threshold voltage (Vthi) of said nonvolatile memory elements are substantially equalized to each other. By way of example, the difference voltage between both the voltages is set at a voltage (for example, a voltage of 50 mV) which is smaller than the voltage width (ΔVth) of an input voltage range within which the sense amplifier is subjected to a transient response operation (that is, the so-called "high sensitivity range" of the sense amplifier). More desirably, when the mutually different logical states of the pair of nonvolatile memory elements are determined by the relatively low threshold voltage state of one nonvolatile memory element and the relatively high threshold voltage state of the other nonvolatile memory element, the initial threshold voltage is set at a voltage which is near the average value of the relatively low threshold voltage (VthL) and the relatively high threshold voltage (VthH).

In a charge holding state, the high threshold voltage (VthH) of the nonvolatile memory element gradually approaches the initial threshold voltage (Vthi) in a thermal equilibrium state, on account of charge leakage ascribable to the electric field of the element itself as is applied to the tunnel film thereof, while the low threshold voltage (VthL) gradually approaches the initial threshold voltage (Vthi) in the thermal equilibrium state, on account of an electric field in a charge gain direction attributed to the word line selection voltage (Vread) in the readout mode. As described above, the initial threshold voltage (Vthi) and the readout word line selection voltage (Vread) are set to be substantially equal within the range of the voltage width within which the sensitivity of the sense amplifier is high. Thus, even if one nonvolatile memory element has turned faulty due to the gradual fall of the threshold voltage of the nonvolatile memory element having the high threshold voltage (VthH) or the gradual rise of the threshold voltage of the nonvolatile memory element having the low threshold voltage (VthL), the threshold voltage of the faulty memory element stops falling or rising in a state which is substantially equal to the word line selection voltage. The faulty nonvolatile memory element is therefore in the transient state or intermediate state between its ON state and its OFF state, whereby its signal state transmitted to the sense amplifier through the data line brings this sense amplifier into the input state of the transient response operation. Accordingly, if the state of the other nonvolatile memory element is normal, there is the very high possibility that the stored information of the correct logical value before the deterioration can be obtained by the differential amplification action of the sense amplifier. Thus, the capability of long-term data retention is enhanced, and a lowering of the rate of readout faults can be realized.

Especially in case of previously setting the initial threshold voltage at a voltage near the average value between the low threshold voltage and the high threshold voltage, it is possible to substantially equalize the probability of occurrence of faults ascribable to the gradual fall of the high threshold voltage (VthH) of the nonvolatile memory element and the probability of occurrence of faults ascribable to the gradual rise of the low threshold voltage (VthL) of the nonvolatile memory element, whereby the retention capability for the stored information can be enhanced to the utmost.

The nonvolatile memory element, which can be produced by a manufacturing process, such as a single-layer polysilicon process, has a MIS transistor (MFSn), and a control gate (CGT) which is disposed so as to interpose an insulating film between it and the floating gate (FGT) of the MIS transistor. The control gate is formed of an impurity-doped layer. In more detail, the source (ST3) and drain (DT3) are formed of semiconductor regions of second conductivity type which are provided in a semiconductor region (121) of first conductivity type, the floating gate is formed of a conductive layer (PSi) which is arranged over a channel defined between the source and the drain, through a gate insulating film (G03), and the control gate is formed of a semiconductor region (122) of the second conductivity type which is arranged under the portion of the conductive layer extended from the floating gate, through the gate insulating film (G03).

For the purpose of controlling the threshold voltages, an impurity of the first conductivity type is introduced into the floating gate of the nonvolatile memory element which can be produced by the manufacturing process such as the single-layer polysilicon process, whereby the initial threshold voltage of the nonvolatile memory element is readily set at a voltage which is approximately at the middle between the high threshold voltage and the low threshold voltage. Even in the case of introducing the impurity as stated above, a CMOS process can be applied to the manufacture of the MIS transistors for constructing the nonvolatile memory elements. In an alternative case where the threshold voltages are adjusted by the ion implantation of the first conductivity type impurity into the channel of the MIS transistor (MFsn), a photo-mask for the channel ion implantation is added to the CMOS process in the manufacture of the MIS transistors (MFSn).

The nonvolatile memory can be utilized for the storage of remedy information for remedying the defects of a volatile memory, such as a SRAM. By way of example, such an SRAM can construct a cache memory which is connected to a central processing unit. Besides, the nonvolatile storage device can construct a part or the whole of a programmable logic circuit whose stored information determines an output logical function corresponding to an input.

[2] A second feature of the invention consists in the fact that the thickness of the gate insulating films of the nonvolatile memory elements is determined considering the relationship thereof with the thickness of the gate insulating films of any other circuit. More specifically, a gate insulating film which is comparatively thick is adopted for an external interface circuit in order to enhance the electrostatic withstand voltage of an input MIS transistor whose gate is connected to an external terminal. Besides, in a semiconductor integrated circuit in which an operating supply voltage such as 3.3 V externally fed is stepped down to the operating supply voltage of an internal circuit, the MIS transistor of an external interface circuit which operates by receiving the 3.3 V has a gate oxide film which is thick as compared with that of the MIS transistor of the internal circuit, from the standpoint of enhancing the withstand voltage of the internal circuit. With notice taken of this, in a semiconductor integrated circuit (101) in which logic circuits (109, 107), nonvolatile memories (113, 114, 115) and an external interface circuit (103) are merged and packaged on a semiconductor substrate, the gate insulating films (GO3) of the MIS transistors (MFSn) for constructing the nonvolatile memory elements which can be produced by the manufacturing process such as the single-layer polysilicon process are equalized in thickness within the allowable range of errors ascribable to process deviations, to the gate insulating films (GO1) of the MIS transistors (MIOn) included in the external interface circuit. In other words, the gate insulating films of the MIS transistors for constructing the nonvolatile memory elements and those of the MIS transistors included in the external interface circuit are simultaneously fabricated by utilizing an identical process or a common photo-mask. In this manner, the thickness of the gate oxide films in the nonvolatile memory elements of the single-layer gate structure is made common with the thicknesses of the gate oxide films of the MIS transistors of the other circuits, whereby the nonvolatile memory elements (130) can be endowed with a somewhat long information retention capability while preferentially avoiding any complication of the manufacturing process of the semiconductor integrated circuit.

In a case where a satisfactory information retention capability cannot be ensured in point of the gate insulating film thickness when equalizing the gate insulating film thickness of the nonvolatile memory elements to that of the MIS transistors of the external interface circuit as explained above, the memory cell (131) in which the nonvolatile memory elements (130) are connected in the differential form can be adopted. Further, the information retention capability can be enhanced still more in such a way that, as described in connection with the first feature, the initial threshold voltage of the nonvolatile memory elements is determined in relation to the sensitivity of the sense amplifier and the word line selection voltage and also in relation to the high threshold voltage and low threshold voltage of the nonvolatile memory elements.

Further, when notice is taken of the other circuits which are merged and packaged in the semiconductor integrated circuit including the nonvolatile memories, the thickness of the gate insulating films of the MIS transistors of the nonvolatile memory elements can be equalized to that of the gate insulating films of the MIS transistors included in the DRAM. In addition, the gate insulating films of the MIS transistors for constructing the nonvolatile memory elements are formed to be thicker than those of the MIS transistors included in the logic circuit.

When notice is taken of the fact that the nonvolatile memory elements can be formed using the manufacturing process, such as the single-layer polysilicon process, the floating gates of the MIS transistors constructing the nonvolatile memory elements, the gates of the MIS transistors included in the logic circuit, the gates of the MIS transistors included in the input/output circuit, and the gates of the MIS transistors included in the DRAM may be formed to have equal film thicknesses within the allowable range of errors ascribable to process deviations. That is, even with the single-layer polysilicon process or the like single-layer gate process, it is possible to obtain a semiconductor integrated circuit, such as a system LSI in which a DRAM formed of the nonvolatile memory having an excellent data retention capability, etc. is simultaneously merged and packaged.

BRIEF DESCRIPTION OF THE DRAWINGS

FIG. 21 is a vertical sectional view of the essential portions of a device during a process step for manufacturing the system LSI in FIG. 2, in a case where gate oxide films have two sorts of thicknesses and where a CMOS process adopting single-layer polysilicon gates is employed;

FIG. 22 is a vertical sectional view of the essential portions of the device during manufacturing steps subsequent to the process step in FIG. 21;

FIG. 23 is a vertical sectional view of the essential portions of the device during manufacturing steps subsequent to the process step in FIG. 22;

FIG. 24 is a vertical sectional view of the essential portions of the device during manufacturing steps subsequent to the process step in FIG. 23;

DESCRIPTION OF THE PREFERRED EMBODIMENTS

[System LSI]

Figure 2:
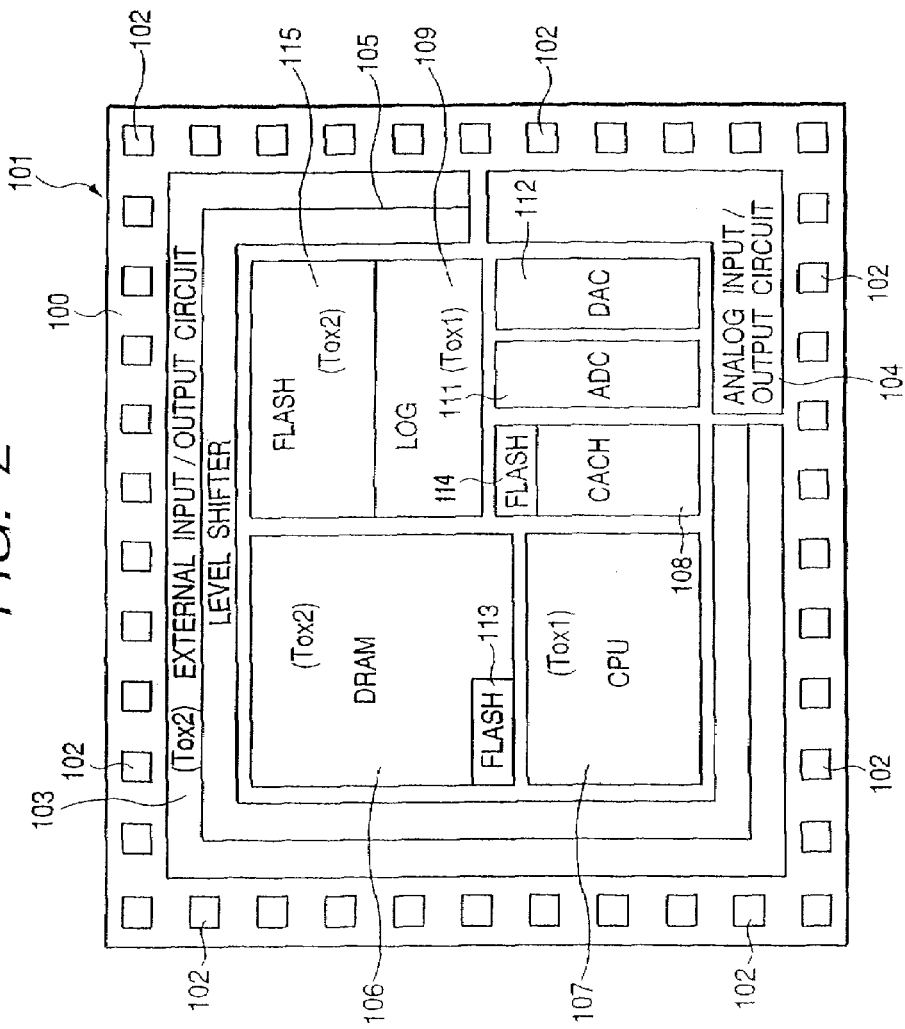
FIG. 2 is a schematic chip plan diagram of the system LSI which is an example of the semiconductor integrated circuit according to the present invention.

Schematically shown in FIG. 2 is a chip plan view of a system LSI which represents an example of a semiconductor integrated circuit according to the present invention. Although the invention is not especially restricted thereto, the system LSI 101 illustrated in the figure is so constructed that a large number of external connection electrodes, such as bonding pads, 102 are arranged at the peripheral edge of a semiconductor substrate 100, and that an external input/output circuit 103 and an analog input/output circuit 104 are disposed inside the electrodes 102. The external input/output circuit 103 and the analog input/output circuit 104 have an operating supply voltage which is an external supply voltage of relatively high level, such as 3.3 V. A level shifter 105 steps down the external supply voltage to an internal supply village such as 1.8 V. Inside the level shifter 105, there are a dynamic random access memory (DRAM) 106, a central processing unit (CPU) 107, a cache memory (CACH) 108, a logic circuit (LOG) 109, a phase-locked loop circuit (PLL) (not shown), an analog-to-digital conversion circuit (ADC) 111, and a digital-to-analog conversion circuit (DAC) 112. Indicated at numerals 113 to 115 are electrically erasable and programmable nonvolatile memories, for example, flash memories, respectively. The DRAM 106, CPU 107, LOG 109 and CACH 108 are operated by their operating supply voltage which is the internal supply voltage, such as 1.8 V, fed from the level shifter 105. The DRAM 106, however, steps up the internal supply voltage so as to form a word line selection level, which is used as the operating supply voltage of a word driver etc. Each of the flash memories 113 to 115 is operated with the internal supply voltage in a data readout operation, but it requires a high voltage in erase and write operations. The high voltage may be formed by an internal booster circuit, or may well be fed from outside and through a predetermined external connection electrode in the predetermined operating mode of the system LSI, such as the EPROM writer mode thereof to be described later.

The flash memory 113 is utilized for storing the remedy information (control information for replacing faulty memory cells with redundant memory cells) of the DRAM 106, while the flash memory 114 is utilized for storing the remedy information of the cache memory 108 and is packaged instead of a remedying program circuit based on the use of fuses. The flash memory 115 constitutes a programmable logic circuit whose stored information determines the logical function of an output in response to an input. By way of example, the flash memory 115 functions as a logic circuit in which results each having been obtained by executing a predetermined logical operation for the plurality of bits of an address signal are held as data beforehand, so as to deliver a predetermined logical operation result corresponding to the combination of the logical values of address input signals.

Although the invention is not especially restricted thereto, the system LSI 101 includes complementary MIS transistors (insulated-gate field effect transistors) which are formed on a single semiconductor substrate such as single-crystal silicon by single-layer polysilicon gate processes, and whose gate oxide films have two sorts of thicknesses.

Although the invention is not especially restricted thereto, the external input/output circuit 103, analog input/output circuit 104, DRAM 106, flash memories 113 to 115, ADC 111 and DAC 112 include MIS transistors each of which has a gate length of 0.4 $\Phi$m and a gate oxide film thickness of 8 nm (Tox2) in case of employing 0.2 $\Phi$m process technology. The reasons therefor are that a comparatively large thickness should desirably be set for a tunnel oxide film formed of a gate oxide film, in order to make the information retention capability of the flash memory favorable, and besides, that a certain degree of withstand voltage (a withstand voltage against the breakdown of the gate oxide film) needs to be ensured relative to the operating voltage of the MIS transistor. Accordingly, the gate insulating films of the MIS transistors constituting the nonvolatile memory elements of the flash memories, those of the MIS transistors included in the external interface circuit, etc. come to have equal thicknesses within the allowable range of errors ascribable to process deviations. Although the invention is not especially restricted thereto, the allowable range of the thicknesses of the gate insulating films based on the process deviations is ±0.5 nm or so for a target film thickness of 8.0 nm in case of a process whose minimum working dimension is 0.25 $\Phi$m to 0.2 $\Phi$m, and it is ±0.3 nm or so for a target film thickness of 6.5 nm in case of a process whose minimum working dimension is 0.18 $\Phi$m to 0.15 $\Phi$m.

On the other hand, the circuits whose operating supply voltage is the comparatively low internal voltage stepped down, that is, the logic circuit 109, cache memory 108 and CPU 107 include MIS transistors each of which has a gate length of 0.2 $\Phi$m and a gate oxide film thickness of 4 nm (Tox1). Although the invention is not especially restricted thereto, the level shift circuit 105 includes MIS transistors of both the gate oxide film thicknesses.

The gate electrodes of the respective MIS transistors having the different gate oxide film thicknesses are formed of polysilicon layers of identical film thickness. Here, the identical film thickness of the polysilicon layers signify film thicknesses which are equal within an allowable range based on process deviations. Although the invention is not especially restricted thereto, the allowable range of the thicknesses of the gate films based on the process deviations is ±10% or so for a target film thickness of 30 nm to 200 nm.

The foregoing gate oxide films having equal thicknesses can be produced using an identical photomask, and also the foregoing polysilicon gates having equal thicknesses can be produced using an identical photo-mask. In this manner, the thicknesses of the gate oxide films in the nonvolatile memory elements of the single-layer gate structure are made common with those of the gate oxide films of the MIS transistors of the other circuits, whereby the nonvolatile memory elements of the flash memories 113 to 115 can be endowed with a somewhat long information retention capability while preferentially avoiding any complication of the manufacturing process of the system LSI 101.

[Nonvolatile Memory Element]

Figure 1:
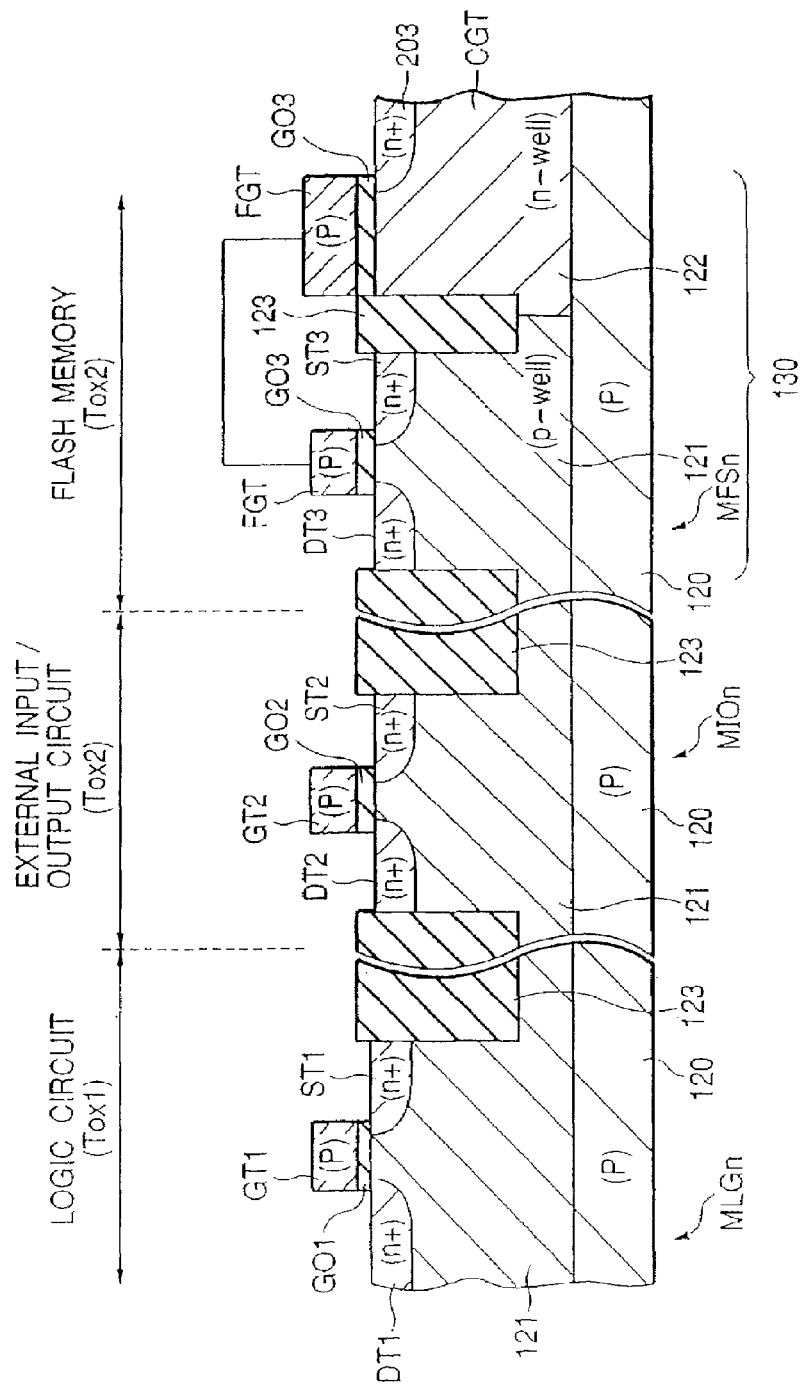
FIG. 1 is diagram schematically showing the sectional structures of the nonvolatile memory elements of flash memories and MIS transistors of n-channel type included in an external input/output circuit as well as a logic circuit, the memories and the circuits being merged in a system LSI which is an example of a semiconductor integrated circuit according to the present invention.

Schematically shown in FIG. 1 are the sectional structures of the nonvolatile memory elements of the flash memories 113 to 115, and the MIS transistors of n-channel type included in the external input/output circuit 103 as well as the logic circuit 109.

The MIS transistor MLGn included in the logic circuit 109 is formed within a p-type well region 121 which is formed in a p-type semiconductor substrate 120. The p-type well region 121 is isolated by an element isolation region 123. The MIS transistor MLGN includes a gate oxide film (Tox1) GO1 having a thickness of 4 nm, a gate GT1 formed of an n-type polysilicon film having a thickness of 200 nm, a source ST1 formed of an n-type region, and a drain DT1 formed of an n-type region. The MIS transistor MIOn for the external input/output circuit is formed within a p-type well region 121 which is formed in the p-type semiconductor substrate 120. The p-type well region 121 is isolated by the isolation region 123. The MIS transistor MIOn includes a gate oxide film GO2 (Tox2) having a thickness of 8 nm, a gate GT2 formed of an ntype polyskiicon film having a thickness of 200 nm, a source ST2 formed of an n-type region, and a drain DT2 formed of an n-type region.

Figure 7:
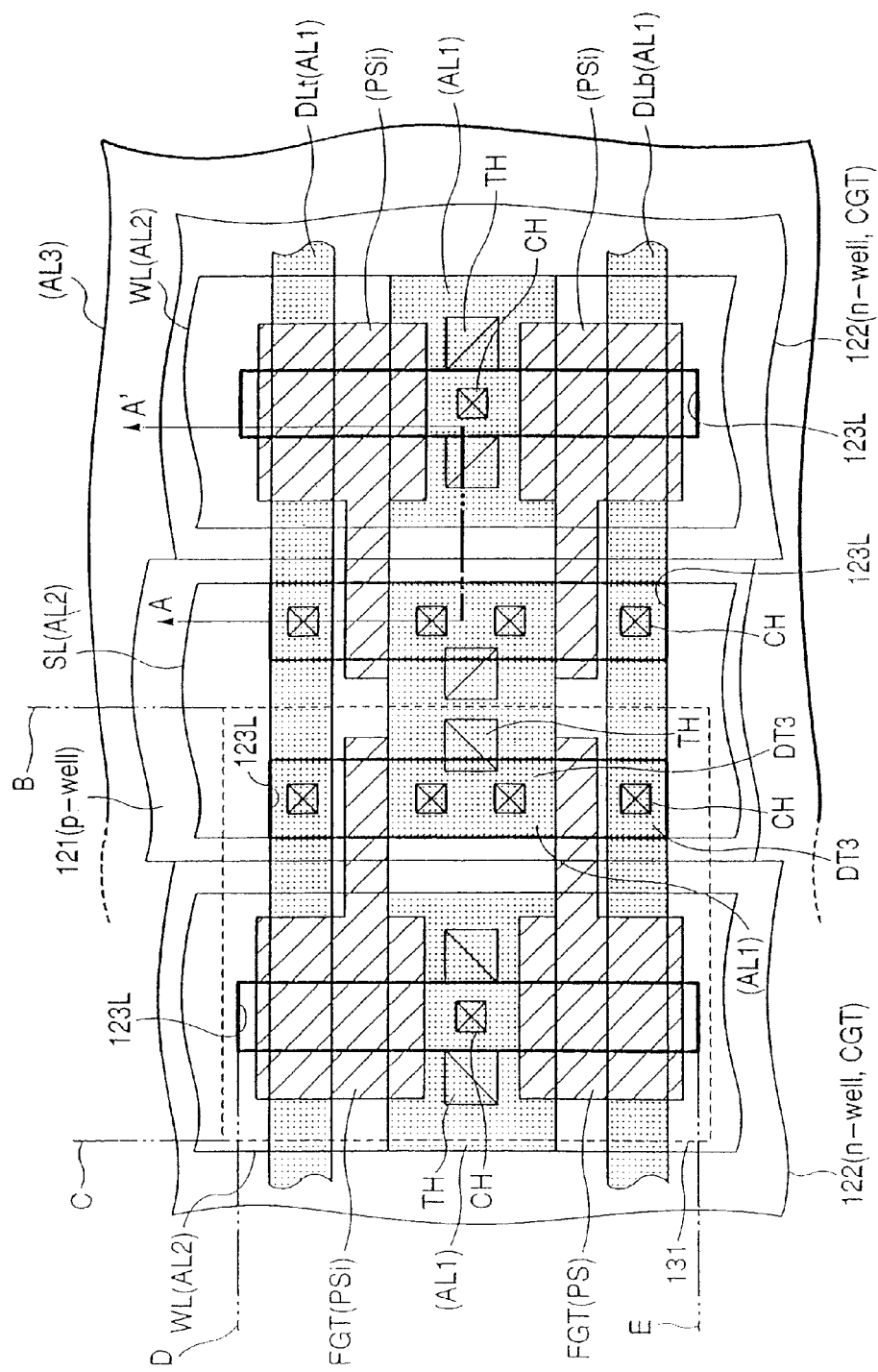
FIG. 7 is a plan layout view of the memory cells in FIG. 6, depicted in device structure fashion.

The nonvolatile memory element 130 of each of the flash memories 113 to 115 includes a MIS transistor MFSn, and a coupling capacitance electrode constituting a control gate CGT. More specifically, the MIS transistor MFSn is formed within a p-type well region (p-well) 121 which is formed in the p-type semiconductor substrate 120. The p-type well region is isolated by the element isolation region 123. The MIS transistor MFSn includes a source ST3 of n-type region, a drain DT3 of n-type region, the gate oxide film G03 (Tox2) having a thickness of 8 nm as is provided on a channel lying between the source ST3 and the drain DT3n, and a floating gate FGT formed of the n-type polysilicon film having a thickness of 200 nm as is arranged on the gate oxide film GO3. The control gate CGT is an n-type well region (n-well) 122 which is formed in the p-type semiconductor substrate 120. The n-type well region 122 is isolated by the element isolation region 123. The n-type well region 122 is overlain by the extension portion of the floating gate FGT through the gate oxide film GO3. In the sectional view of FIG. 1, the floating gate FGT is depicted as if it were broken midway between the MIS transistor MFSn and the control gate CGT, but it is actually formed to be unitary as shown in FIG. 7 which will be referred to later. By the way, the n-type well region 122 is formed with an n-type region 203 for the electrode connection of the control gate CGT.

Figure 3:
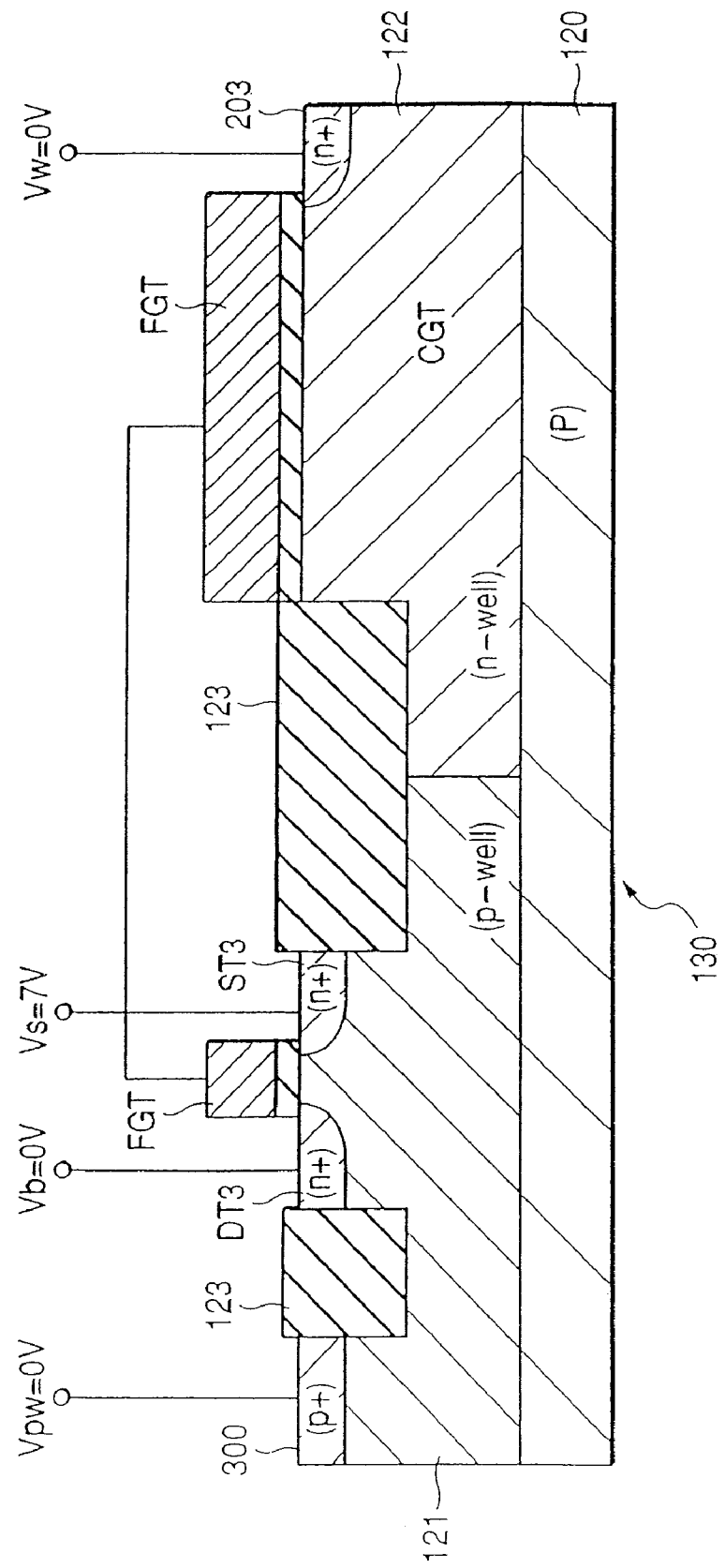
FIG. 3 is a diagram showing the erase operation state of the nonvolatile memory element shown in FIG. 1.

FIG. 3 will be referred to for explaining the erase operation of the nonvolatile memory element 130. In the erase operation, the p-type well region 121 and the n-type well region 122 forming the control gate CGT are brought to 0 volt such as the ground potential, that is, Vpw=0 V and Vw=0 V hold; a positive voltage of 7 V, that is, Vs=7 V is applied to the source ST3; and 0 volt such as the ground potential, that is, Vb=0 V is applied to the drain DT3; whereby electrons are extracted from the floating gate FGT into the source ST3 by a tunneling current. Thus, the threshold voltage of the nonvolatile memory element 130 as viewed from the control gate (word line) is lowered down to, for example, 2 V. Consequently, the state of the threshold voltage of the element 130 is brought into the erase state. As apparent from the device structure of the nonvolatile memory element 130, the control gate CGT is formed in the n-type well region 122, so that the word line voltage Vw is not brought to a negative voltage. In the erase operation, therefore, the source voltage Vs is held at Vs=7 V relative to the word line voltage Vw=0 V.

Figure 4:
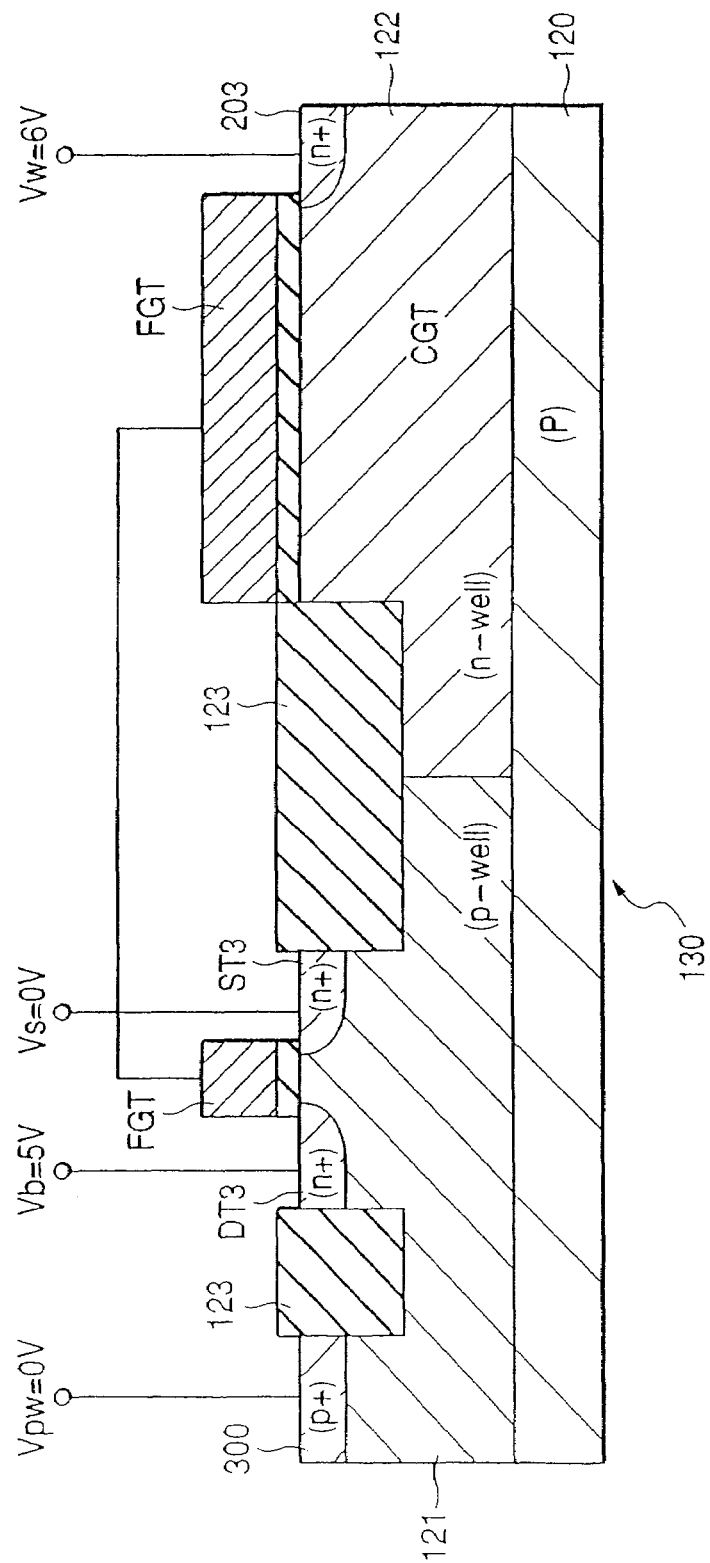
FIG. 4 is a diagram showing the write operation state of the nonvolatile memory element shown in FIG. 1.

FIG. 4 is a view for explaining the write operation of the nonvolatile memory element 130. In the write operation, the p-type well region 121 is held at 0 V (Vpw=0 V), the n-type well region 122 forming the control gate (word line) is at 6 V (Vpw=6 V), the source ST3 is at the ground potential (Vs=0 V), and the drain DT3 is at 5 V (Vb=5 V). As a result, hot electrons created in the drain DT3 are injected into the floating gate FGT, and the threshold voltage of the nonvolatile memory element 130 as viewed from the control gate (word line) CGT is raised up to, for example, 4 V. Consequently, the state of the threshold voltage of the element 130 is brought into the write state. By the way, the threshold voltage of the write state of the element 130 and that of the erase state thereof may well be set reverse to the above.

Figure 5:
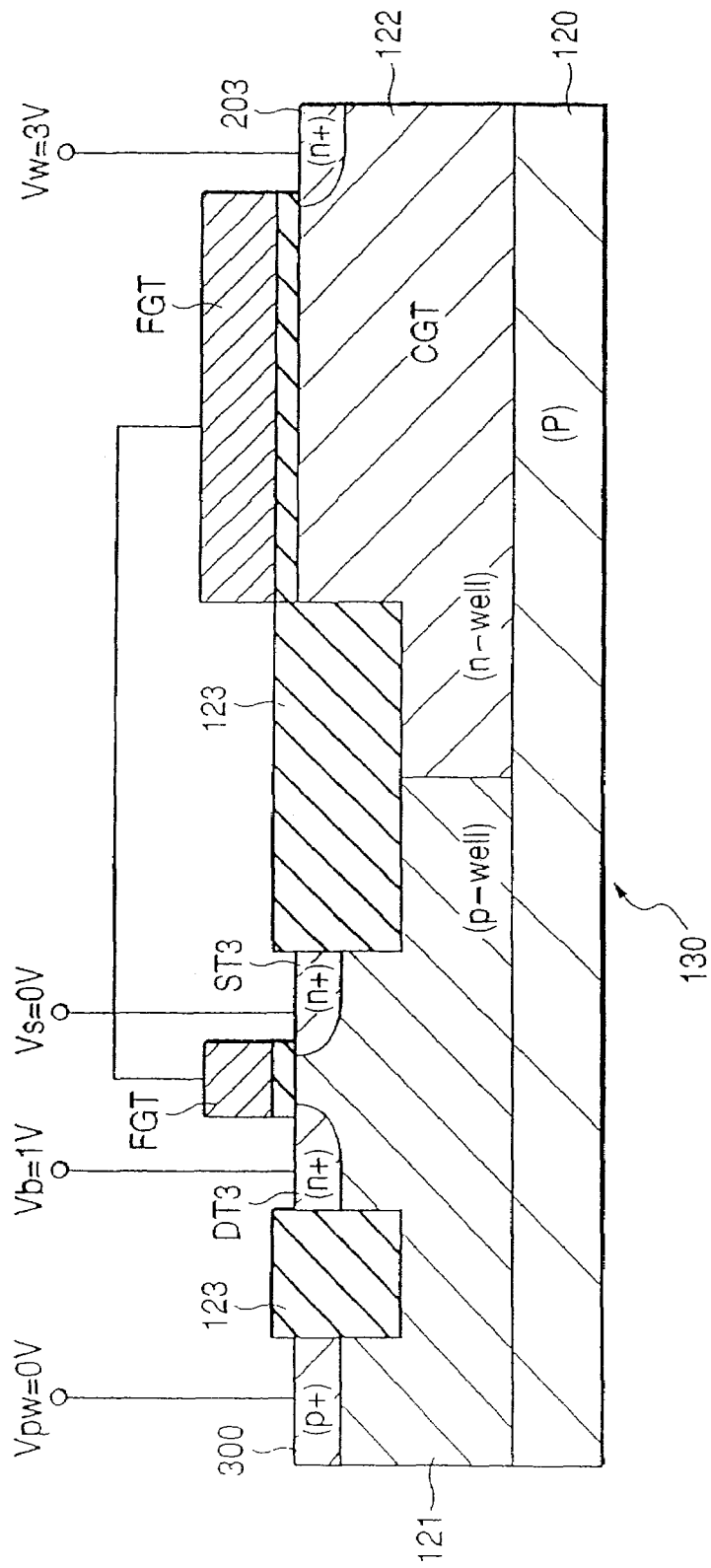
FIG. 5 is a diagram showing the readout operation of the nonvolatile memory element shown in FIG. 1.

FIG. 5 will be referred to for explaining the readout operation of the nonvolatile memory element. In the readout operation, the p-type well region 121 is held at the ground potential (Vpw=0 V), the n-type well 122 forming the control gate (word line) CGT is at 3 V (Vpw=3 V), the source ST3 is at the ground potential (Vs=0 V), and the drain DT3 at 1 V (Vb=1 V). Thus, the threshold voltage as viewed from the control gate (word line) CGT is determined. The 1 V level of the drain DT3 is the precharge level of a data line to which this drain is connected. On this occasion, the readout word line voltage (Vpw=3 V) is held at the middle value between the threshold voltage VthL (VthL=2 V) in the erase state and the threshold voltage VthH (VthH=4 V) in the write state. This point will be explained in detail later.

[Memory Cell in Differential Connection Form]

Figure 6:
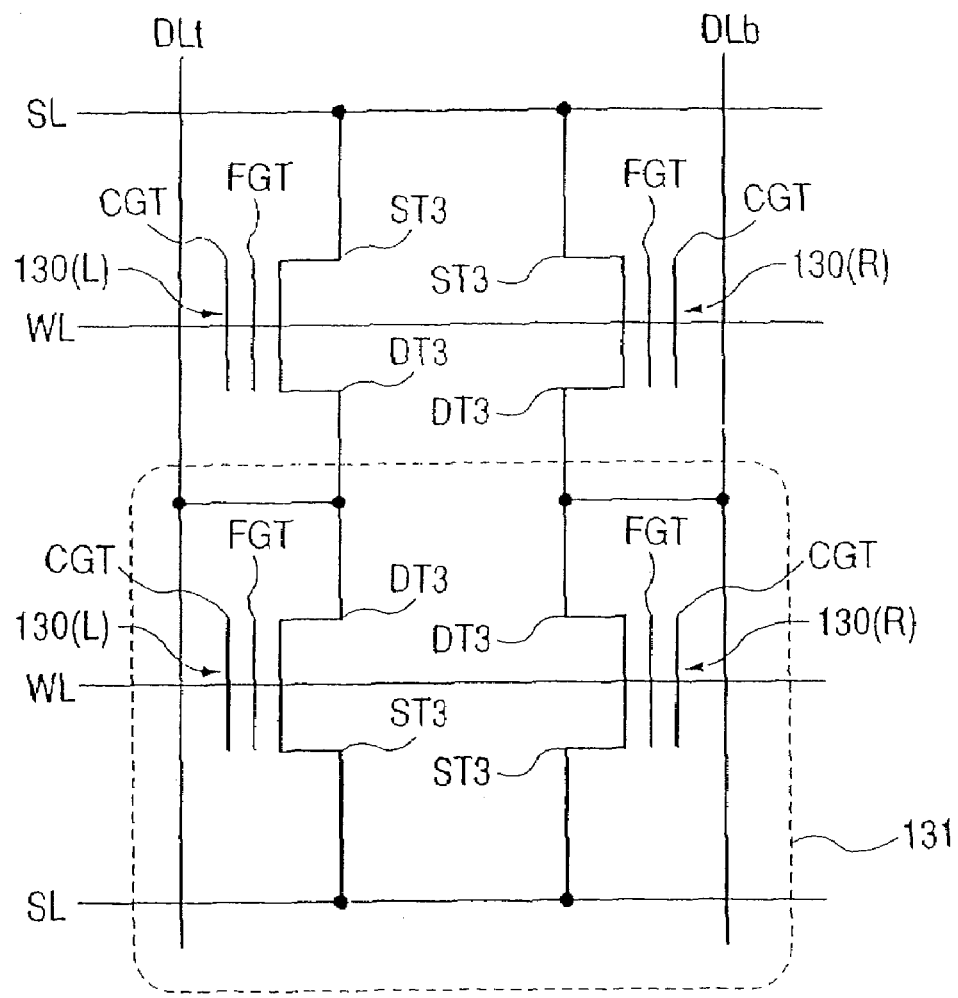
FIG. 6 is a circuit diagram showing an example of a memory cell which is configured of a pair of nonvolatile memory elements in a differential form.

FIG. 6 exemplifies a circuit diagram of a memory cell 131 which is configured of one pair of nonvolatile memory elements 130 in a differential form. Although there is no special restriction, the two nonvolatile memory elements 130, each of which includes the MIS transistor MFSn and the control gate CGT, constitute the memory cell (unit cell) 131 corresponding to 1 bit. Each of the nonvolatile memory elements 130 has the source ST3, drain DT3, floating gate FGT and control gate CGT, and one pair of control gates CGT are connected in common to the word line WL of a corresponding row. The drain of one nonvolatile memory element 130(L) is connected to one data line DLt of a pair of complementary data lines of a corresponding column, while the drain of the other nonvolatile memory element 130(R) is connected to the other data line DLb of the pair of complementary data lines of the corresponding column. In addition, the sources ST3 are connected to a common source line SL of every group of nonvolatile memory elements which constitute an erasing unit.

FIG. 7 exemplifies the plan layout of the two memory cells shown in FIG. 6. Incidentally, the section of the nonvolatile memory elements 130 in FIG. 6 correspond to a sectional view taken along line A-A' in FIG. 7.

Referring to FIG. 7, one memory cell 131 is indicated by a broken line, and it is formed of the elements 130 formed in the p-type well region 121, and the n-type well flaw region 122 formed adjacent to the p-type well region 121 and for forming the control gates CGT. The outer side of a rectangle denoted by symbol 123L is the element isolation region 123. The floating gates FGT are formed of polysilicon layers PSi. The n-type well region 122 forming the control gates CGT is connected to a first aluminum conductive layer AL1 through a contact hole CH, and the first aluminum conductive layer AL1 is further connected to the word line WL made of a second aluminum conductive layer AL2, through throughholes TH. The n-type well region 122 extends along the word line. The pair of complementary data lines DLt, DLb are formed of the first aluminum conductive layer. The drains DT3 in the p-type well region 121 are connected to the pair of complementary data lines DLt, DLb through contact holes CH. The sources ST3 in the p-type well region 121 are connected to the first aluminum conductive layer AL1 through a contact hole CH, and the first aluminum conductive layer AL1 is further connected to the source line SL made of the second aluminum conductive layer AL2, through a through-hole TH. The top surface of the elements 130 thus constructed is entirely covered with a third aluminum conductive layer AL3 in order to shield the elements 130 from light for the purpose of the prevention of soft errors ascribable to ultraviolet rays etc. Incidentally, a capacitance (C2) is formed through the gate oxide film between the n-type well region 122 to serve as the control gates (word line) CGT and the polysilicon layers PSi to serve as the floating gates FGT. A coupling ratio, C2/(C1+C2) which is determined by the gate capacitance (C1) of the MIS transistor 130 and the capacitance (C2) mentioned above is set at, for example, 0.8. As understood from FIG. 7, other memory cells are arranged around the memory cell 131 so as to become mirror-symmetric with respect to two-dot chain lines B, C, D and E. Thus, the memory cells are constructed. Incidentally, it will be readily understood by one skilled in the art that p-type regions 300 each serving to set the potential of the p-type well 121 as shown in FIGS. 3 to 5 are disposed at predetermined intervals under the source lines SL (AL2) though not illustrated.

[Flash Memory]

Figure 8:
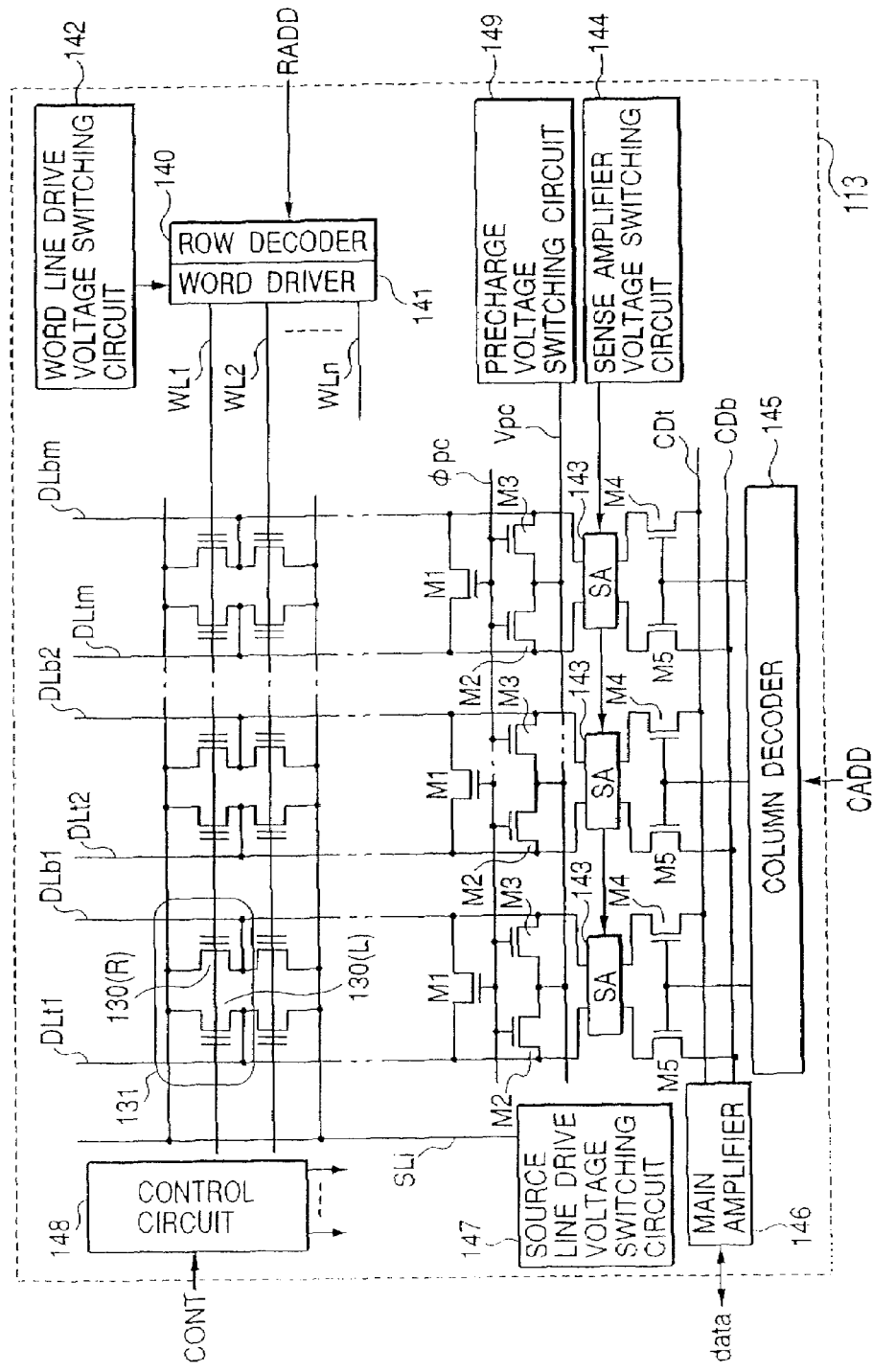
FIG. 8 is a schematic diagram of a flash memory which employs memory cells of differential connection form.

FIG. 8 illustrates a schematic block diagram of the flash memory 113 which employs the memory cells 131 in the differential connection form. Incidentally, each of the other flash memories 114 and 115 is constructed similarly to the flash memory 113.

In the memory array of the flash memory 113, the memory cells 131 are arranged in the shape of a matrix. The control gates of the memory cells 131 are coupled to the word lines WL1 to WLn of corresponding rows, the drains thereof are coupled to the pairs of complementary data lines DLtl, DLbl to DLtm, DLbm of corresponding columns, and the sources thereof are coupled to the source line SLi of every erasing unit block. A row decoder 140 forms a word line selection signal in accordance with a row address signal RADD, etc. A word driver 141 drives the word line which is selected by the word line selection signal. The drive voltage of the word line is given to the word driver 141 by a word line drive voltage switching circuit 142 in accordance with the erase, write or readout operation for the nonvolatile memory elements 130. Incidentally, a latch circuit for holding the row address signal RADD may well be disposed at the input portion of the row decoder 140.

The pairs of complementary data lines DLtl, DLbl to DLtm, DLbm are respectively coupled to the differential input/output terminals of sense amplifiers (SA) 143 through equalize MIS transistors M1 and precharge MIS transistors M2, M3. Symbol Vpc denotes a precharge voltage, and symbol Φpc a precharge/equalize control signal. A precharge voltage switching circuit 149 switches and delivers the precharge voltages Vpc in accordance with the erase, write and readout operations for the nonvolatile memory elements 130. The operating supply voltage of the sense amplifiers 143 are switched and fed by a sense amplifier supply voltage switching circuit 144 in accordance with the erase, write and readout operation modes for the nonvolatile memory elements 130. Further, the pairs of complementary data lines DLtl, DLbl to DLtm, DLbm are connected in common to a pair of complementary common data lines CDt, CDb through column selection MIS transistors M4, M5. A column decoder 145 decodes a column address signal CADD, and controls one pair of column selection MIS transistors M4, M5 into their ON states. Incidentally, a latch circuit for holding the column address signal CADD may well be disposed at the input portion of the column decoder 145. The pair of complementary common data lines CDt, CDb are coupled to the data input/output terminals of a main amplifier 146. The main amplifier 146 delivers the differential signal of the pair of complementary common data lines CDt, CDb to the outside of the flash memory in single-end fashion, and complementarily drives the pair of complementary common data lines CDt, CDb in accordance with the logical value of a write signal received from outside the flash memory. Source line drive voltage switching circuit 147 switches and feeds to the source line SLi source line voltages corresponding to the erase, write and readout operations for the nonvolatile memory elements 130. A control circuit 148 executes the entire control of the flash memory, such as the control of operation timings and the selection of the respective operating voltages for the erase, write and readout operations of the nonvolatile memory elements 130, in accordance with the plurality of instruction signals CONT of access operations from outside the flash memory. The voltages which are applied to the nonvolatile memory elements 130 in the erase, write and readout operations are controlled as described with reference to FIGS. 3 to 5. Incidentally, the operations specified by the instruction signals CONT may well include a write verify operation and an erase verify operation.

Figure 9:
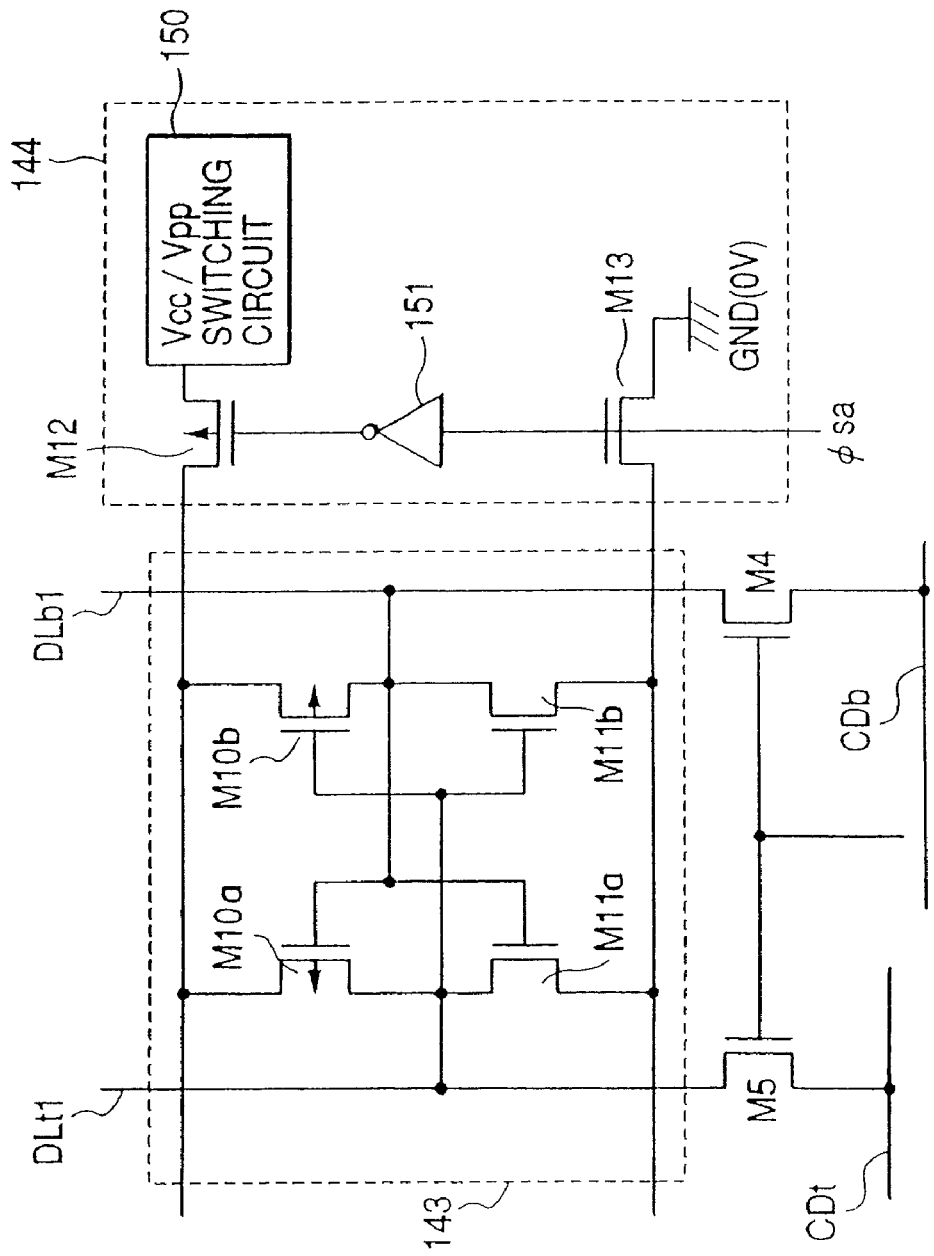
FIG. 9 is a circuit diagram showing a practical example of a sense amplifier which is provided in the flash memory in FIG. 8.

An example of the sense amplifier is shown in FIG. 9. The sense amplifier 143 has a pair of complementary MIS inverter circuits each of which includes a series circuit consisting of a p-channel type MIS transistor M10$a$ or M10$b$ and an n-channel type MIS transistor M11$a$ or M11$b$, and it is constructed as a differential amplifier circuit in which the input of one of the complementary MIS inverter circuits is coupled to the output of the other crosswise. The output of a supply voltage/ writing high voltage (Vcc/Vpp) switching circuit 150 is connected to the sources of the MIS transistors M10$a$ and M10$b$ through a p-channel type MIS transistor M12, and the sources of the MIS transistors M11$a$ and M11$b$ are connected to the ground voltage GND (=0 V) through an n-channel type MIS transistor M13. The supply voltage/writing high voltage (Vcc/Vpp) switching circuit 150 delivers a supply voltage Vcc=1.8 V in the readout mode, and a writing high voltage Vpp=5.5 V in the write mode. The MIS transistors M12, M13 function as power switches for the sense amplifier 143, and a sense amplifier activation control signal Φsa is fed to the gate of the MIS transistor M13, while a signal obtained by inverting the sense amplifier activation control signal Φsa by means of an inverter 151 is fed to the MIS transistor M13. The sense amplifier activation control signal Φsa is brought to its high level at a timing at which the sense amplifier is to be operated. By the way, in the erase operation, the sense amplifier 143 maintains its inactive state, and the pair of complementary data lines are held at the ground voltage (=0 V) through the precharge MIS transistors M2, M3. The voltages of 7 V, 5 V and 6 V, which are the high voltages necessary for the erase and write operations for the nonvolatile memory elements 130 as respectively described with reference to FIGS. 3 and 4, may be directly inputted from outside the flash memory, or they may well be generated by stepping up the supply voltage of 1.8 V or the external supply voltage of 3.3 V by the use of the internal booster circuit. The word line selection level of 3 V necessary for the readout operation for the nonvolatile memory elements 130 as described with reference to FIG. 5 may be generated either by stepping up the internal supply voltage of 1.8 V by the use of the internal booster circuit, or by stepping down the external supply voltage of 3.3 V by the use of an internal step-down circuit.

The stored information of the memory cell 131 is determined by those logical states of the two nonvolatile memory elements 130 which are different from each other. By way of example, the logical value "1" of the stored information of the memory cell 131 is obtained by the write state of the left memory cell 130(L) in which the threshold voltage is high, and the erase state of the right memory cell 130(R) in which the threshold voltage is low. When the memory cell 131 in such a state is selected in the readout operation, the flash memory in FIG. 8 is so operated, for example, that the data line DLt1 keeps the precharge level to hold a high level, while the data line DLb1 is discharged to become a low level, that the resulting difference voltage is sensed and amplified by the sense amplifier 143, and that the data of the logical value "1" is delivered outside through the main amplifier 146.

On the other hand, the logical value "0" of the stored information of the memory cell 131 is obtained by the erase state of the left memory cell 130(L) in which the threshold voltage is low, and the write state of the right memory cell 130(R) in which the threshold voltage is high. When the memory cell 131 in such a state is selected in the readout operation, the flash memory in FIG. 8 is so operated, for example, that the data line DLb1 keeps the precharge level to hold the high level, while the data line DLt1 is discharged to become the low level, that the resulting difference voltage is sensed and amplified by the sense amplifier 143, and that the data of the logical value "0" is delivered outside through the main amplifier 146.

In case of writing the data of the logical value "1" into the memory cell 131, the nonvolatile memory elements 130(L), 130(R) are brought into the erase state, whereupon only the left nonvolatile memory element 130(L) is programmed into the write state by the differential amplification action of the sense amplifier 143 for the pair of complementary data lines, in accordance with the complementary signals of the pair of complementary common data lines CDt, CDb driven to the complementary levels by the write data of the logical value "1" inputted to the main amplifier 146. In case of writing the data of the logical value "0" into the memory cell 131, only the right nonvolatile memory element 130(R) is programmed into the write state conversely to the above, after the nonvolatile memory elements 130(L), 130(R) are brought into the erase states.

[Initial Threshold Voltage and Word Line Selection Voltage]

Figure 10:
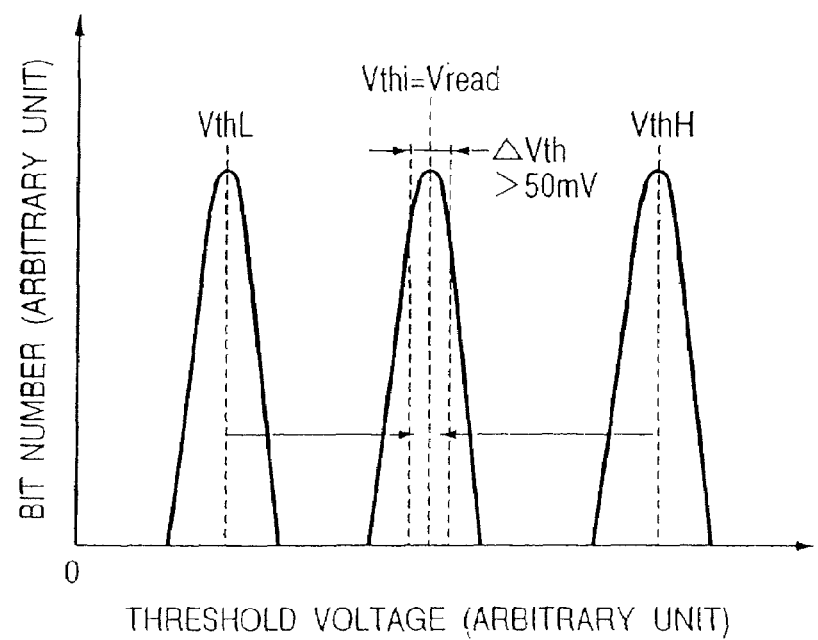
FIG. 10 is a graph relevant to the threshold voltage distribution of the nonvolatile memory elements, showing the relationship between an initial threshold voltage and a word line selection voltage.
Figure 11:
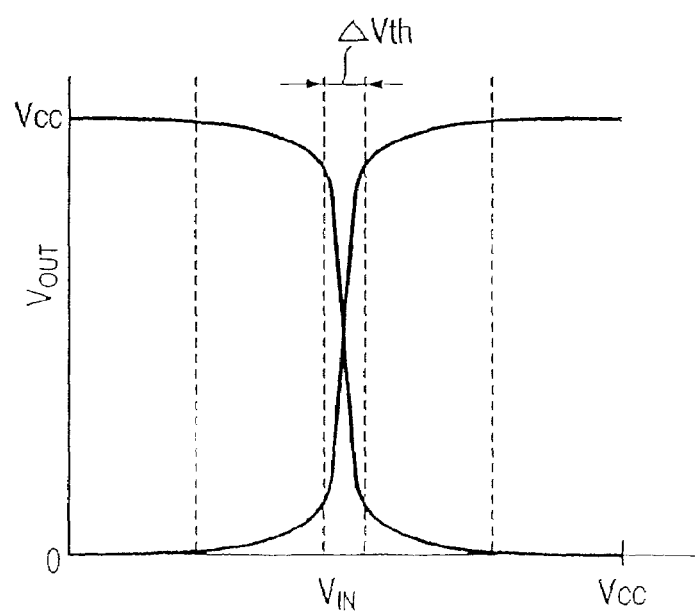
FIG. 11 is a graph showing an example of the input/output characteristics of the sense amplifier.
Figure 12:
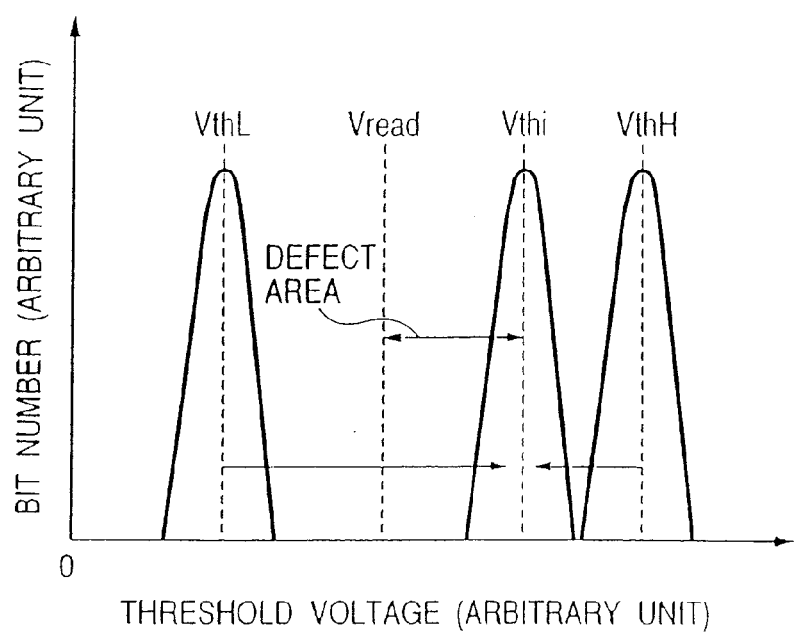
FIG. 12 is a graph showing the threshold voltage distribution of a memory cell in the case where an initial threshold voltage is set comparatively high.
Figure 13:
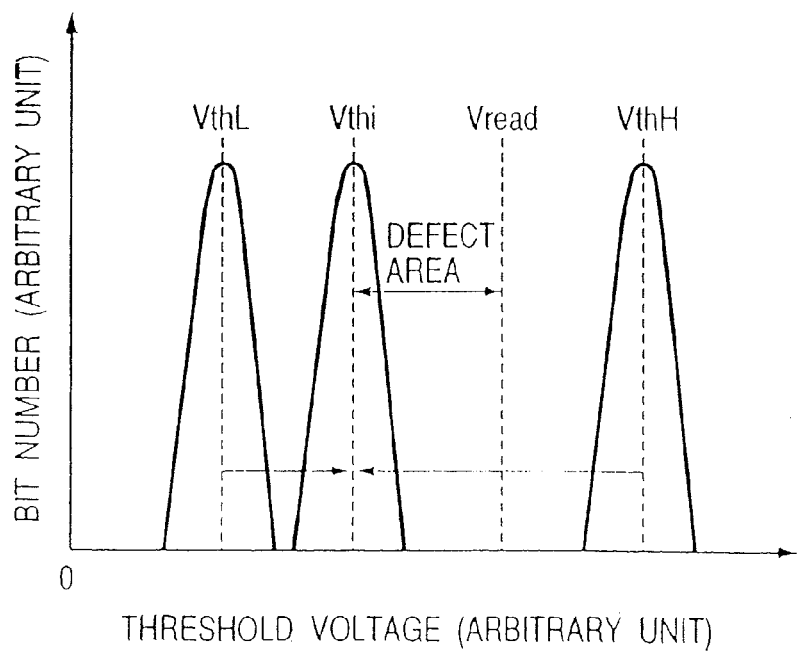
FIG. 13 is a graph showing the threshold voltage distribution of a memory cell in the case where an initial threshold voltage is set comparatively low.

FIG. 10 illustrates the relationship between the initial threshold voltage Vthi of the nonvolatile memory elements 130 and a selection voltage Vread for the word line. The initial threshold voltage Vthi of the nonvolatile memory elements 130 is determined considering the operating point of the sense amplifier 143 and the word line selection voltage Vread. More specifically, the selection voltage Vread which is applied to the word line WL for the purpose of the information readout from the nonvolatile memory elements 130 and the initial threshold voltage Vthi of the nonvolatile memory elements 130 are substantially equalized to each other. By way of example, the difference voltage between both the voltages is set at a voltage (for example, a voltage of 50 mV) which is smaller than the voltage width ΔVth of an input voltage range within which the sense amplifier 143 is caused to execute a transient response operation (that is, the so-called "high sensitivity range" of the sense amplifier 143). FIG. 11 illustrates an example of the input/output characteristics of the sense amplifier 143. The region of the voltage width ΔVth is a range within which both of the MIS transistors M10 and M11 constituting the sense amplifier 143 operate in their saturation regions. In addition to the fulfillment of the above condition, especially the example of FIG. 10 sets the initial threshold voltage Vthi at a voltage near the average value of the low threshold voltage VthL and the high threshold voltage VthH. In the description of FIGS. 3 and 4, the high threshold voltage VthH in the write state is 4 V, and the low threshold voltage VthL in the erase state is 2 V. On this occasion, the initial threshold voltage Vthi and the word line selection voltage Vread in the readout operation are set at 3 V by way of example.

In a charge holding state, the high threshold voltage VthH of the nonvolatile memory element 130 gradually approaches the initial threshold voltage Vthi in a thermal equilibrium state, on account of charge leakage ascribable to the electric field of the element itself as is applied to the tunnel film on the other hand, the low threshold voltage VthL of the nonvolatile memory element 130 gradually approaches the initial threshold voltage Vthi in the thermal equilibrium state, on account of an electric field in a charge gain direction attributed to the word line selection voltage Vread in the readout mode. As described above, the initial threshold voltage Vthi and the readout word line selection voltage Vread are set to be substantially equal within the range of the voltage width ΔVth within which the sensitivity of the sense amplifier 143 is high. Thus, even if one nonvolatile memory element 130(L) or 130(R) of the memory cell 131 has turned faulty due to the gradual fall of the threshold voltage of the nonvolatile memory element 130 having the high threshold voltage VthH or the gradual rise of the threshold voltage of the nonvolatile memory element having the low threshold voltage VthL, the threshold voltage of the faulty memory element 130(L) or 130(R) is brought into a state which is substantially equal to the word line selection voltage Vread. The faulty nonvolatile memory element 130(L) or 130(R) is therefore in the transient state or intermediate state between its ON state and its OFF state, whereby its signal state transmitted to the sense amplifier 143 through the data line brings this sense amplifier 143 into the input state of the transient response operation. Accordingly, if the state of the other nonvolatile memory element 130 of the memory cell 131 is normal, there is the very high possibility that the stored information of the correct logical value of the memory cell 131 before the deterioration will be reproducible by the differential amplification action of the sense amplifier. Thus, the long-term data retention capability of the memory cell 131 is enhanced, and lowering in the rate of readout faults can be realized.

Especially in case of previously setting the initial threshold voltage Vthi at the voltage near the average value between the relatively low threshold voltage VthL and the relatively high threshold voltage VthH, it is possible to substantially equalize the probability of occurrence faults ascribable to the gradual fall of the high threshold voltage VthH of the nonvolatile memory element 130 and the probability of occurrence of faults ascribable to the gradual rise of the low threshold voltage VthL of the nonvolatile memory element 130. Thus, the long-term retention capability of the memory cell 131 for the stored information can be enhanced to the utmost.

The initial threshold voltage Vthi can be controlled by, for example, the ion implantation of a p-type impurity into the floating gate FGT because the nonvolatile memory element 130 is of the n-channel type. As explained before, the nonvolatile memory element 130 which can be produced by the single-layer polysilicon gate process has the MIS transistor, and the control gate disposed so as to interpose the insulating film between it and the floating gate of the MIS transistor. For the purpose of controlling the threshold voltages, a p-type impurity similar to that of the p-type well region 121 is introduced into the floating gate FGT of the nonvolatile memory element 130 which can be produced by the single-layer polysilicon gate process, whereby the initial threshold voltage of the nonvolatile memory element 130 is readily set at the voltage which is approximately the middle between the high threshold voltage and the low threshold voltage. Even in such a case of introducing the impurity, a CMOS process can be applied to the manufacture of the MIS transistor MFSn constituting the nonvolatile memory element 130. In an alternative case where the threshold voltages are adjusted by introducing an n-type impurity into the channel of the MIS transistor MFSn, a photo-mask for the channel implantation is added to the CMOS process in the manufacture of the MIS transistors MFSn.

Here, that lowering of the rate of readout faults which is attained by the memory cell structure of the differential connection form as in the memory cell 131 will be described as to probabilities. As explained before, the setting of Vthi=Vread substantially equalizes the probabilities at which the faults of the nonvolatile memory elements of the high threshold voltage VthH occur due to the threshold voltage fall and at which the faults of the nonvolatile memory elements of the low threshold voltage VthL occur due to the threshold voltage rise. As a premise therefor, there will be derived the rate of readout faults in the case of the memory cell in the 2-cells/1-bit form in which 1 bit is configured of two nonvolatile memory elements. By way of example, letting f denote the probability of faults after 10 years in the case of a memory cell of 1-cell/1-bit configuration in which 1 bit is configured of one nonvolatile memory element, the following holds:

State (1): Probability Pa at which both the 2 cells are faultless, $$Pa=(1-f)^2 \quad (1)$$

State (2): Probability Pb at which either of the cells is faulty, $$Pb=(1-f)f+f(1-f)=2f(1-f) \quad (2)$$

State (3): Probability Pc at which both the 2 cells are faulty, $$Pc=f^2 \quad (3)$$

Here, $$Pa+Pb+Pc=(1-f)^2+2f(1-f)+f^2=1$$

holds. Letting letter N denote the total number of bits of each chip, a faultless chip has quite no bit of the state (3). On this occasion, the N bits ought to lie in either the state (1) or the state (2). Therefore, the probability Y of the faultless chip becomes:

$$Y=3_N C_k Pa^k Pb^{N-k} \quad (4)$$

and the probability F of a faulty chip becomes:

$$F=1-Y=1-3_N C_k Pa^k Pb^{N-k} \quad (5)$$

In accordance with the binomial theorem, $$Y=3_N C_k Pa^k Pb^{N-k}=(Pa+Pb)^N$$

$$=\{(1-f)^2+2f(1-f)\}^N$$

$$=(1-f^2)^N$$

and hence, $$F=1-(1-f^2)^N \quad (6)$$

holds. Meanwhile, the probability Y' of a faultless chip in the case of the 1-cell 1-bit scheme becomes:

$$Y'=(1-f)^N \quad (7)$$

for the reason that even one faulty bit of the N bits makes the chip faulty, and the probability F' of the faulty chip in the case of the 1-cell/1-bit scheme becomes:

$$F'=1-(1-f)^N \quad (8)$$

Accordingly, the improvement factor R of the rate of the chip faults based on the semiconductor integrated circuit device of the present invention becomes:

$$R=Y/Y'=(1+f)N \quad (9)$$

Figure 14:
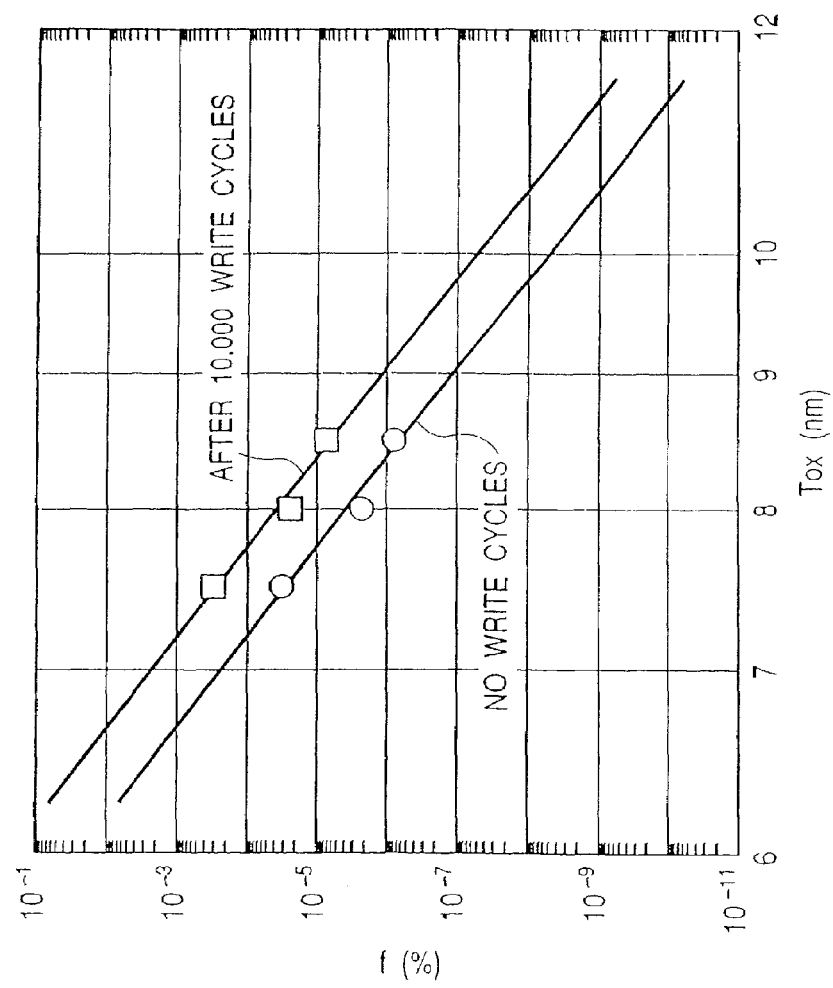
FIG. 14 is graph showing the actual measurement values of the rate f of the faulty bits of retention faults for different thicknesses of tunnel films, the values being used for computing the effect of improving the rate of chip faults.
Figure 15:
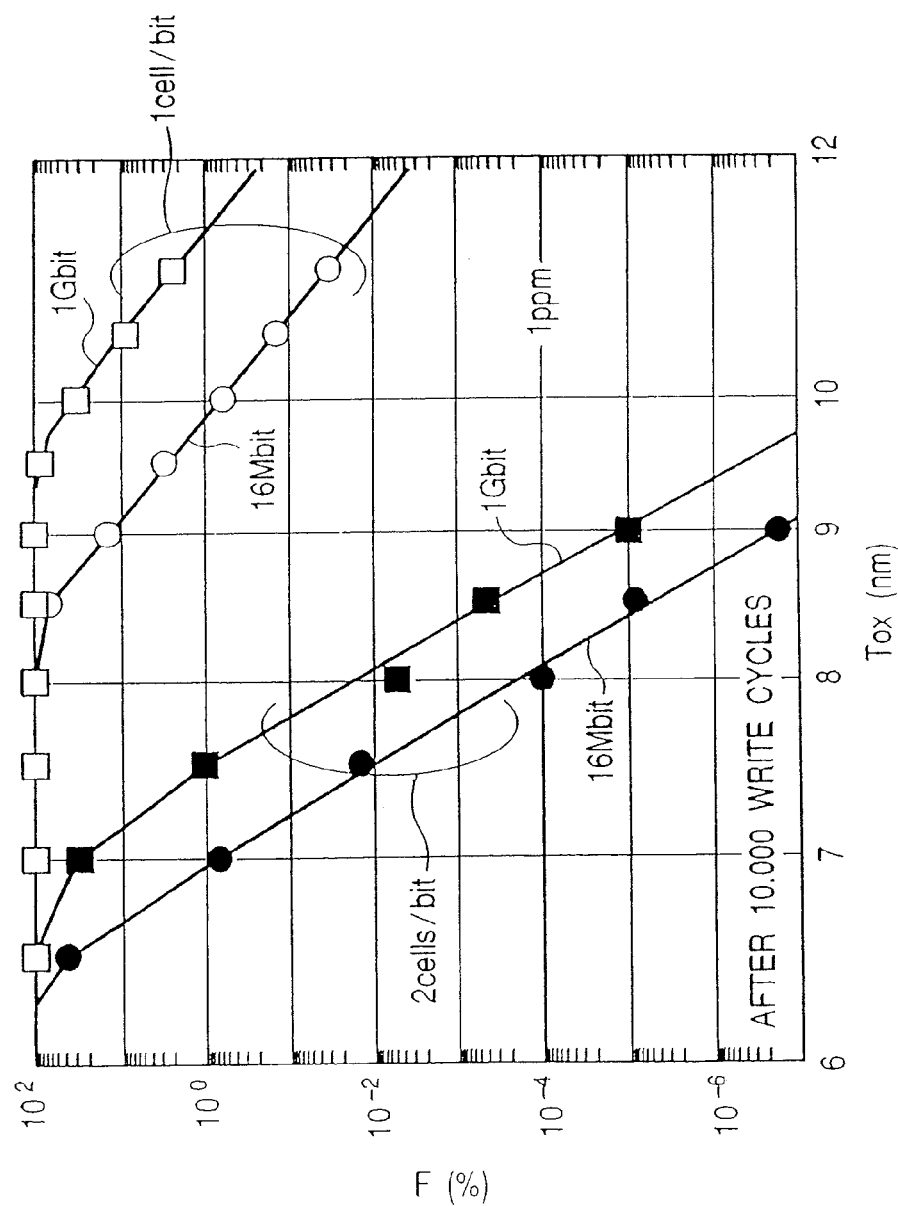
FIG. 15 is a graph showing results obtained by comparing the rates of chip faults in the present invention and a 1-cell/1-bit scheme in the related art.
Figure 16:
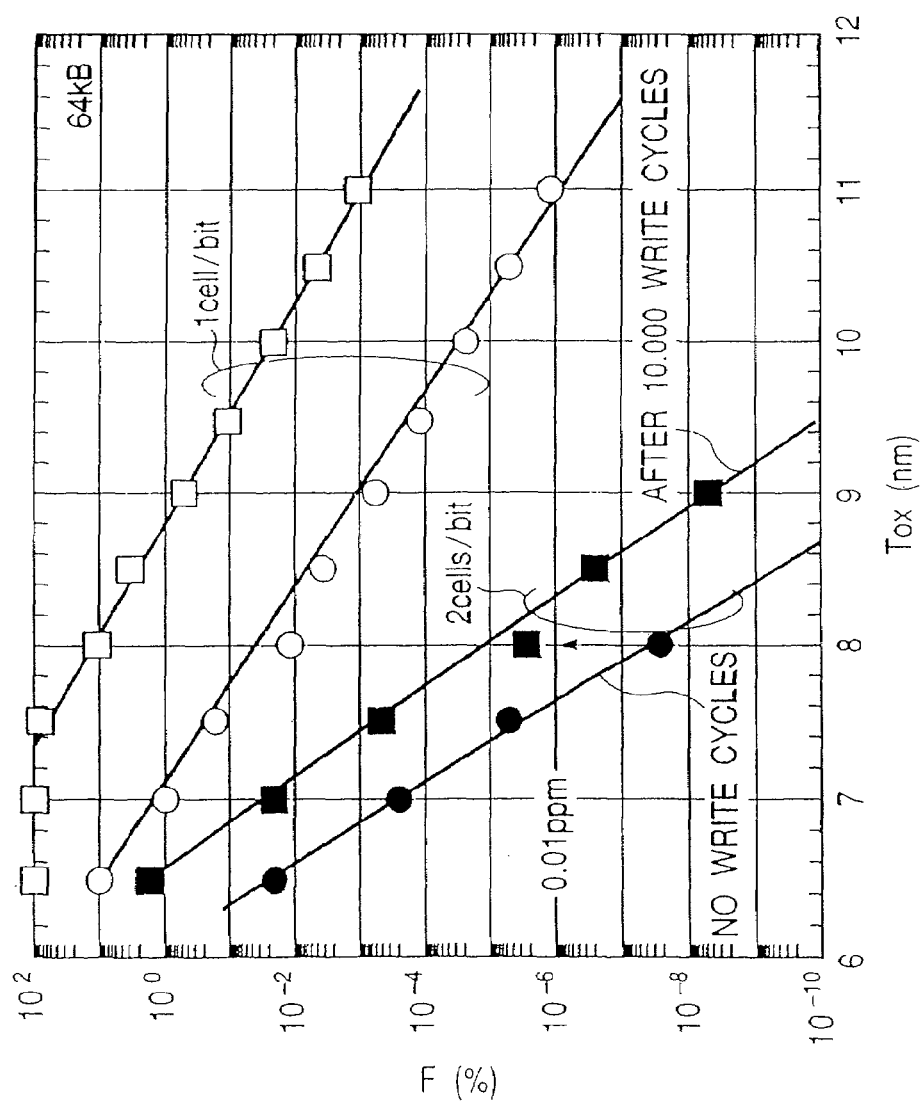
FIG. 16 is a graph showing results obtained by comparing the rate of chip faults of a flash memory of 64 kB which adopts the memory cells of the differential form configured of the nonvolatile memory elements in FIG. 1, with that in the related art 1-cell/1-bit scheme.

FIG. 14 shows values obtained in such a way that the percentage f of the faulty bits of retention faults used for computing the effect of improving the rate of the chip faults as mentioned above was actually measured for different thicknesses of tunnel films. FIG. 14 shows results in the case where data was not rewritten at all and the case where data was rewritten 10,000 times, and it is seen that the percentage of the faults was increased approximately one digit by the rewriting. FIG. 15 shows results obtained in such a way that the probabilities of the faulty chips in the present invention and in the case of the 1-cell/1-bit scheme were compared using the above formulae (6) and (8). The number of times of rewriting was 10,000, and 16 Mbits and 1 Gbit were assumed as the total numbers N of bits. According to the contents of FIG. 15, at the tunnel film thickness of 8 nm, the percentage of the chip faults becomes 100% with the 1-cell/1-bit scheme, whereas the percentage of the chip faults can be lowered down to about 1 ppm for the 16 Mbits and about 100 ppm even for the 1 Gbit with the 2-cells/1-bit memory cells of the present invention. As also understood from the above formula (9), the improvement effect of reliability exceeding 6 digits can be attained by employing the memory cells 131. Consequently, a flash memory can be manufactured while a high reliability is ensured, even in the range of the thicknesses of thin tunnel films having the thickness of 8 nm or below, the range having been unavailable to the memory cells of the 1-cell/1-bit scheme. This signifies that the gate oxide film of the transistor operating with the supply voltage of 3.3 V can be directly used as the tunnel film. FIG. 16 shows results obtained in such a way that the probabilities of the faulty chips in the present invention and in the case of the 1-cell/1-bit scheme were compared as to flash memories of 64 kB employing the memory cells described above. As seen from FIG. 16, even after data was rewritten 10,000 times, the percentage of the chip faults is 0.1 ppm at the tunnel oxide film thickness of 8 nm, and it is 6 digits lower than in the case of the 1-cell/1-bit memory cells.

[Manufacturing Method]

FIGS. 17 thru 20 illustrate the sectional structures of the nonvolatile memory element 130 of the flash memory and the MIS transistor MLGn of the logic circuit in FIG. 1, as to the main steps of a manufacturing process. Incidentally, numerical values to be mentioned in the ensuing description are mere examples, and they are alterable.

Figure 17:
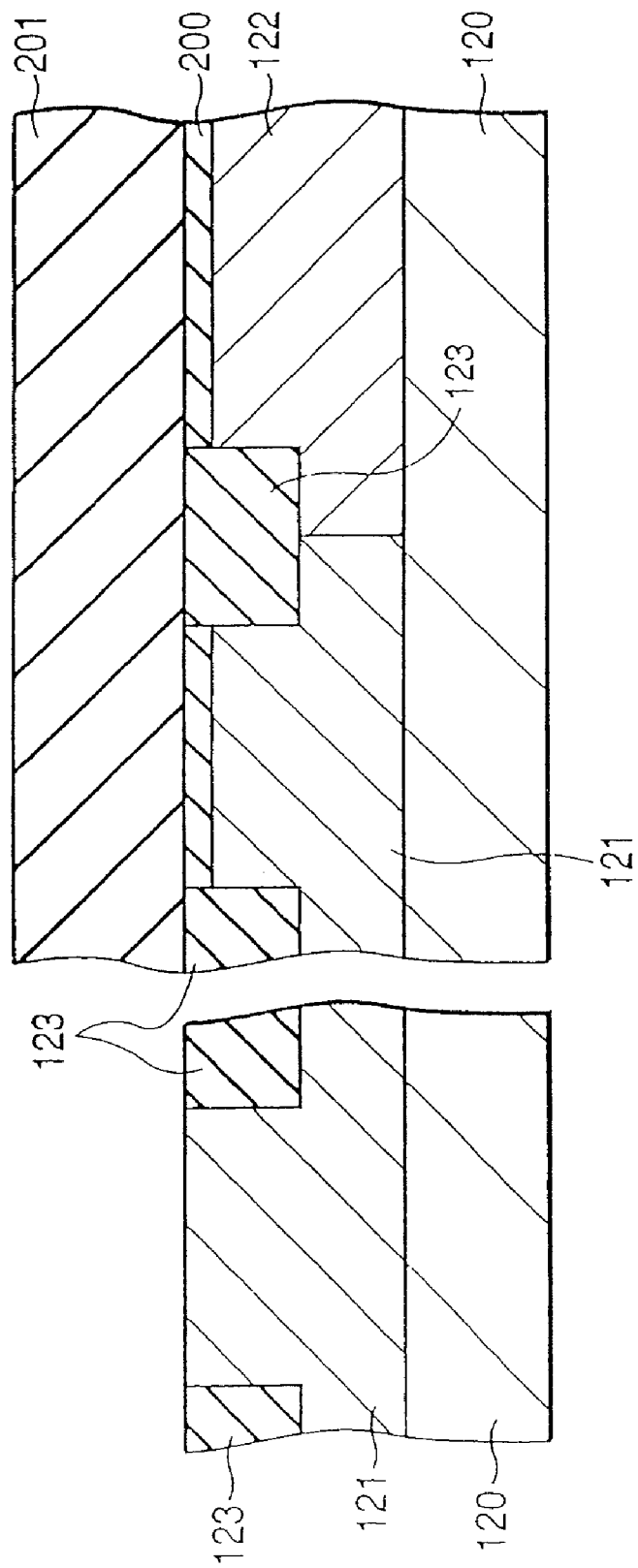
FIG. 17 is a vertical sectional view of the essential portions of a device during a process step for manufacturing the memory cell of the flash memory and the MIS transistor of the logic circuit in FIG. 1.

First, referring to FIG. 17, a p-type well region 121 is formed in a p-type silicon substrate 120 having a resistivity of 10 Ωcm, in such a way that, after a groove type element isolation region 123 which is 0.3 Φm deep has been formed, ion implantations are carried out to implant $B^+$ ions at an acceleration energy of 350 keV by a dose of $1\times10^{12}/cm^2$, $B^+$ ions at an acceleration energy of 150 keV by a dose of $2\times10^{12}/cm^2$, and $BF_2^+$ ions at an acceleration energy of 50 keV by a dose of $5\times10^{12}/cm^2$. Likewise, an n-type well region 122 is formed in such a way that ion implantations are carried out to implant $P^+$ ions at an acceleration energy of 500 kev by a dose of $1\times10^{12}/cm^2$, $P^+$ ions at an acceleration energy of 200 keV by a dose of $2\times10^{12}/cm^2$, and $BF_2^+$ ions at an acceleration energy of 50 keV by a dose of $3\times10^{12}/cm^2$. A high-withstand-voltage gate oxide film 200 having a thickness of 7 nm is grown on the surfaces of the well regions 122, 121 by thermal oxidation at a temperature of 850 EC. Thereafter, a resist film 201 having a thickness of 1 Φm, which is open only in a region where the MIS transistor for the logic circuit is to be formed, is formed by related art lithography, and the high-withstand-voltage gate oxide film 200 in the region where the MIS transistor for the logic circuit is to be formed is removed by wet etching as illustrated in the figure.

Figure 18:
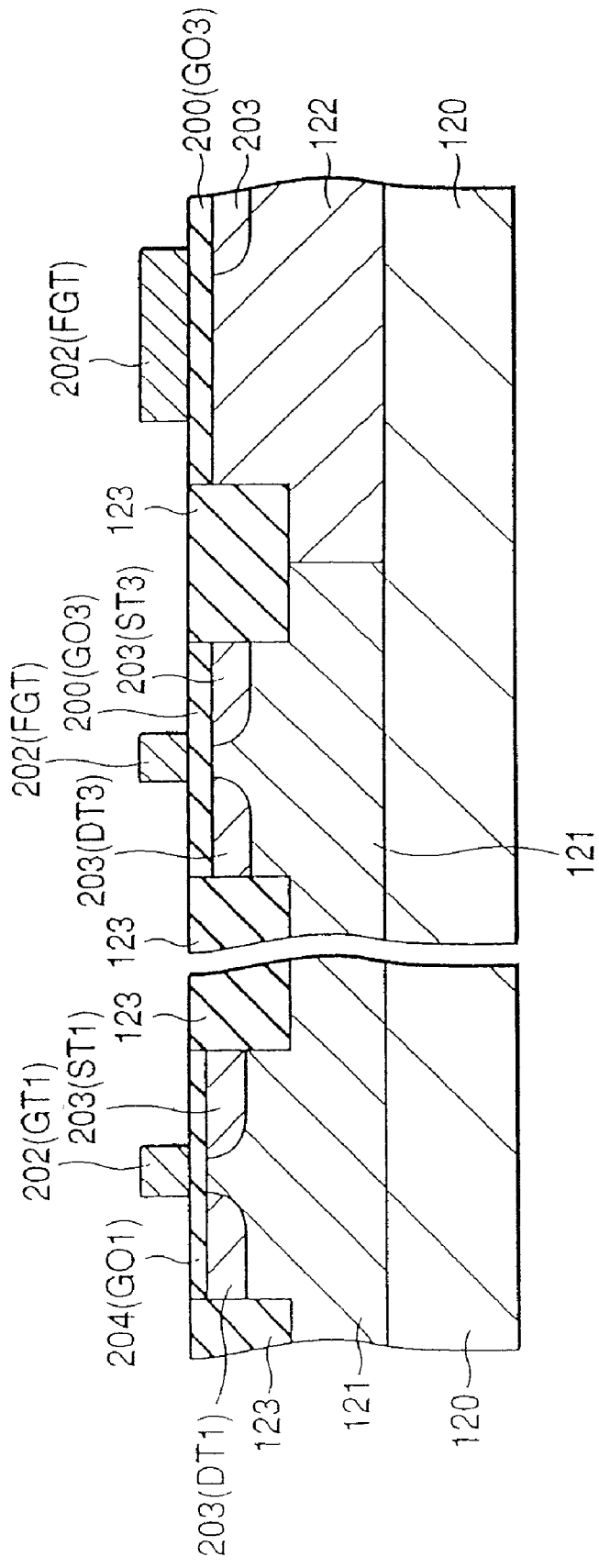
FIG. 18 is a vertical sectional view of the essential portions of the device during manufacturing steps subsequent to the process step in FIG. 17.

Subsequently, the resist film 201 is removed by etching, and the resulting structure is washed. Thereafter, as shown in FIG. 18, a low-withstand-voltage gate oxide film 204 (GO1) having a thickness of 4 nm is grown by thermal oxidation at a temperature of 850° C., while at the same time, the gate oxide film 200 is additionally oxidized to form a high-withstand voltage gate oxide film 200 (GO3) increased to a thickness of 8 nm. The thickened high-withstand-voltage gate oxide film 200 becomes the gate oxide film G03 of the nonvolatile memory element. Thereafter, polysilicon is deposited by CVD (Chemical Vapor Deposition) at a temperature of 600° C., and a polysilicon film having a thickness of 200 nm, which is implanted with P+ ions at an acceleration energy of 20 keV by a dose of 4×1015/cm2, is formed by ion implantation. Besides, a gate electrode 202 (GT1) worked by related art lithography is formed. Thereafter, source and drain regions 203 are formed in such a way that As+ ions at an acceleration energy of 30 kev are implanted by a dose of 3×1015/cm2, by ion implantation whose mask is a resist film being 1 mm thick and being open in the regions of the n-channel type MIS transistor (MLGn) among MIS transistors for the logic circuit and the MIS transistor (MFSn) constituting the flash memory cell. The regions 203 are used as the sources regions ST1, ST2 (see FIG. 1), ST3 and the drain regions DT1, DT2 (see FIG. 1), DT3.

Figure 19:
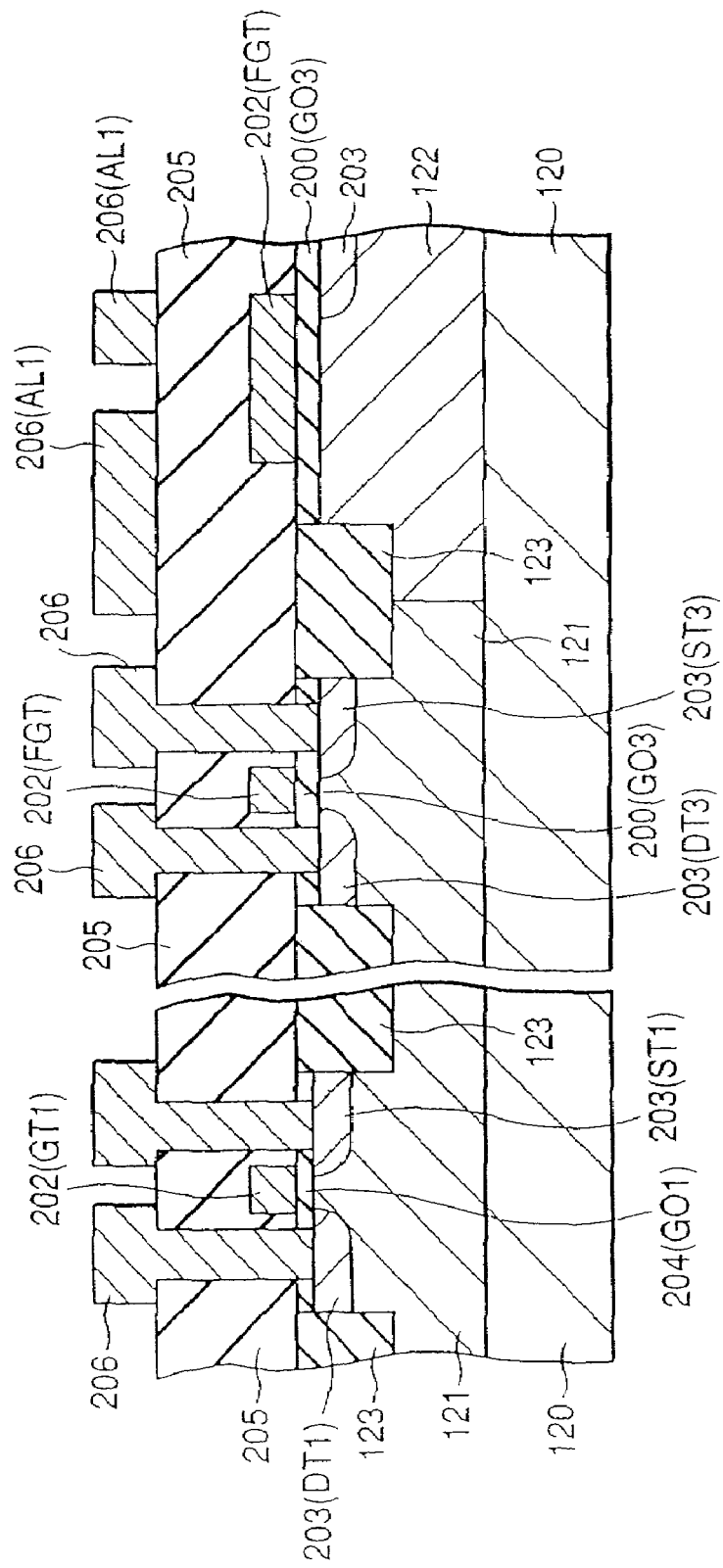
FIG. 19 is a vertical sectional view of the essential portions of the device during manufacturing steps subsequent to the process step in FIG. 18.

Further, FIG. 19 illustrates a state where a silicon oxide film 205 having a thickness of 1 Φm is formed by depositing polysilicon by means of CVD (Chemical Vapor Deposition) at a temperature of 400 EC and flattening the deposited polysilicon by means of CMP (Chemical Mechanical Polishing), and where a first aluminum conductive layer 206 (AL1) is formed by forming contact holes at the desired positions of the film 205, depositing an aluminum film at a thickness of 500 nm by means of sputtering and working the deposited aluminum film by related art lithography.

Figure 20:
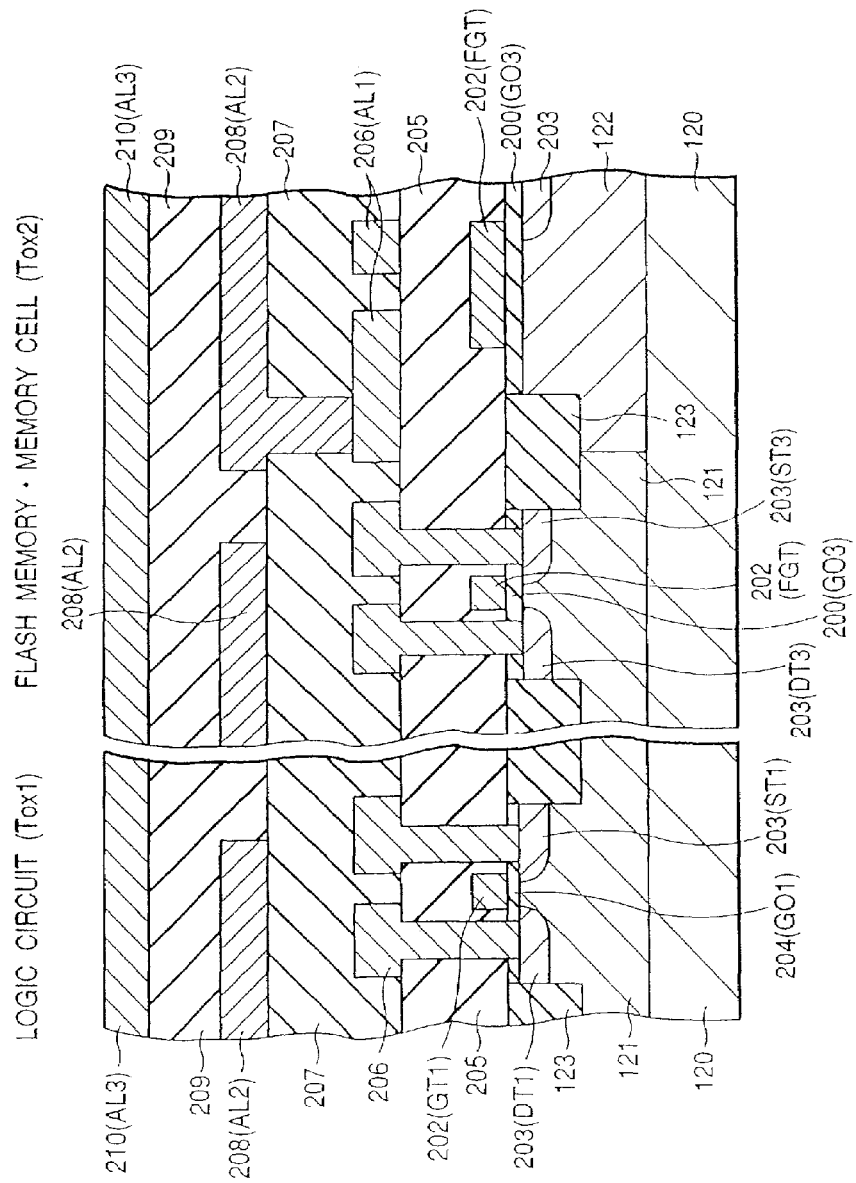
FIG. 20 is a vertical sectional view of the essential portions of the device during manufacturing steps subsequent to the process step in FIG. 19.

Lastly, as shown in FIG. 20, a first interlayer insulating film 207 is formed, a first contact hole is worked, a second aluminum conductive layer 208 (AL2) is formed, a second interlayer insulating film 209 is formed, and a third aluminum conductive layer 210 (AL3) is worked. Further, a passivation film is deposited and worked though not shown, thereby to complete the manufacture of the system LSI of this embodiment in which the flash memory is merged.

As apparent also from the schematic manufacturing process explained above, a gate oxide film 200 which is thicker than the gate oxide film 204 of the logic circuit 109 is grown, and the nonvolatile memory element 130 can be easily formed by the single-layer polysilicon process.

Now, a manufacturing method in the case where a system LSI, in which the nonvolatile memory elements connected in the differential form are included as a flash memory cell, is manufactured using a CMOS process, will be described with reference to FIGS. 21 to 32. In each of the figures, "I/O·NMIS" signifies a domain for forming a MIS transistor of n-channel type which constitutes the external input/output circuit 103, "I/O·PMIS" a domain for forming a MIS transistor of p-Channel type which constitutes the external input/output circuit 103, "LOGIC NMIS" a domain for forming a MIS transistor of n-channel type which constitutes the logic circuit 109, and "LOGIC PMIS" a domain for forming a MIS transistor of p-channel type which constitutes the logic circuit 109. Besides, in each of the figures, "MEMORY CELL DOMAIN" signifies a domain for forming a MIS transistor which constitutes the nonvolatile memory element 130. In the memory cell domain, the capacitance in which the control gate CGT is used as the coupling capacitance electrode is omitted from illustration. In addition, although the difference of the two sorts of thicknesses of the gate oxide films is not discernible in each of the figures, it is set as described with reference to FIGS. 17 to 20. Further, in the ensuing description of the manufacturing method, reference numerals assigned to well regions, semiconductor regions, etc. will be made different from those in the foregoing description for the sake of convenience.

First, as shown in FIG. 21, by way of example, a semiconductor substrate (at this stage, a semiconductor wafer) 3 which is of p-type and whose specific resistance is about 10 Ωcm is wet-oxidized at about 800 EC so as to form a thin silicon oxide film 10 being about 10 nm thick at its surface, and a silicon nitride film 11 having a thickness of about 200 nm is thereafter deposited on the silicon oxide film 10 by CVD (Chemical Vapor Deposition). The silicon oxide film 10 is formed in order to relax stresses which act on the semiconductor substrate 3 in cases where a silicon oxide film buried in an element isolation groove is sintered at a later step, and so forth. The silicon nitride film 11 has the property of being difficult to oxidize, and is therefore utilized as a mask for preventing the oxidation of the substrate surface parts of portions (active regions) which underlie this film 11.

Subsequently, the silicon nitride film 11, silicon oxide film 10 and semiconductor substrate 3 are dry-etched using a photoresist film as a mask, whereby an isolation groove 4a being about 300 to 400 nm deep is formed in the semiconductor substrate 3. The isolation groove 4a may well be formed in such a way that the silicon nitride film 11 is dry-etched using a photoresist film as a mask, that the photoresist film is subsequently removed, and that the silicon oxide film 10 and the semiconductor substrate 3 are dry-etched using the patterned silicon nitride film 11 as a mask.

After such processing, in order to eliminate damage layers produced on the inner walls of the isolation groove 4a by the above etching, the resulting semiconductor substrate 3 is dry-oxidized at about 1000 EC so as to form a thin silicon oxide film being about 30 nm thick on the inner walls of the isolation groove 4a. Subsequently, as shown in FIG. 22, a silicon oxide film 13 having a thickness of about 400 nm is deposited on the resulting semiconductor substrate 3, followed by the wet oxidation of the semiconductor substrate 3, thereby to carry out sintering for improving the quality of the silicon-oxide film 13 buried in the isolation groove 4a. By way of example, the silicon oxide film 13 is deposited by plasma CVD in which ozone ($O_3$) and tetraethoxysilane (TEOS) are employed as a source gas.

Subsequently, a silicon nitride film having a thickness of about 200 nm is deposited on the silicon oxide film 13 by CVD and is thereafter dry-etched using a photoresist film as a mask, whereby the silicon nitride film 14 is left at only the upper parts of those isolation grooves 4a of relatively large area which lie at, for example, the boundary parts between a memory cell array and a peripheral circuit. The silicon nitride film 14 remaining at the upper parts of the isolation grooves 4a is formed for preventing a phenomenon (dishing) in which the silicon oxide film 13 in the isolation grooves 4a of relatively large area is polished deeply as compared with the silicon oxide film 13 in isolation grooves 4a of relatively small area, when the silicon oxide film 13 is polished and flattened by chemical mechanical polishing (CMP) at the next step.

Subsequently, the photoresist film for patterning the silicon nitride film 14 is removed, and the silicon oxide film 13 is thereafter polished and left in the isolation grooves 4a by CMP employing the silicon nitride films 11, 14 as a stopper, thereby to form isolation portions 4. The isolation portions 4 correspond to the element isolation region 123 shown in FIG. 1.

Thereafter, the silicon nitride films 11, 14 are removed, and the resulting semiconductor substrate 3 is subjected to a preoxidation treatment so as to form a gate insulating film which is about 10 nm thick on the semiconductor substrate 3. Thereafter, as shown in FIG. 23, a photoresist pattern 12C which denudes a region to-be-buried and covers any other region is formed on the principal surface of the resulting semiconductor substrate 3, whereupon phosphorus, for example, is ion-implanted into the semiconductor substrate 3 by employing the photoresist pattern 12C as a mask, in order to form a buried region 15 of ntype in the semiconductor substrate 3. Incidentally, at this stage, the n-type buried region 15 is not formed yet because a heat treatment for the activation of the impurity, etc. has not been carried out for the semiconductor substrate 3, but it is shown in the figure in order to facilitate the understanding of the description.

Subsequently, the photoresist pattern 12C is removed, and a photoresist pattern which denudes n-well regions in all the regions and covers any other region is thereafter formed on the principal surface of the resulting semiconductor substrate 3. Next, phosphorus, for example, is ion-implanted into the semiconductor substrate 3 by employing the photoresist pattern as a mask. Here, there are respectively and separately performed at least two impurity introducing steps, including the step of introducing the impurity for forming the n-wells (n-type well regions) 16NW, and the step of introducing the impurity for setting the threshold voltage of a MIS transistor which is to be formed in the n-well 16NW outside the memory cell domain. Thereafter, the photoresist pattern is removed.

Subsequently, as shown in FIG. 24, a photoresist pattern 12D which denudes p-well regions and covers any other region is thereafter formed on the principal surface of the resulting semiconductor substrate 3. Next, boron or boron difluoride, for example, is ionimplanted into the semiconductor substrate 3 by employing the photoresist pattern 12D as a mask. Here, there are respectively and separately performed at least two impurity introducing steps, including the step of introducing the impurity for forming the p-wells (ptype well regions) 16PW, and the step of introducing the impurity for spring the Vth of a MIS transistor which is to be formed in the p-well 16PW outside the memory cell domain. Thereafter, the photoresist pattern 12D is removed.

After such a series of processing steps, the resulting semiconductor substrate 3 is subjected to a heat treatment, whereby the activation of the impurities introduced into the semiconductor substrate 3, etc. are effected to form the n-wells 16NW, p-wells 16PW and n-type buried region 15 in the semiconductor substrate 3. The n-wells 16NW corresponds to the ntype well region 122 shown in FIG. 1, while the p-wells 16PW correspond to the p-type well regions 121 shown in FIG. 1.

After such processing, the manufacturing method shifts to the step of forming a gate insulating film as stated below by way of example. First, an oxidizing treatment for forming a gate insulating film for high-withstand-voltage transistors which are to be formed on the semiconductor substrate 3 is carried out, whereby the gate insulating film which has a first thickness being relatively large and being, for example, about 8 nm is formed on the principal surface of the semiconductor substrate 3. Next, a photoresist pattern which covers regions for forming the high-withstand-voltage transistors and denudes any other region is formed on the gate insulating film, whereupon the parts of the thick gate insulating film denuded by the photoresist pattern are removed, and further the photoresist pattern is removed. Thereafter, the manufacturing method is shifted to the step of forming a gate insulating film for MIS transistors other than the high-withstand-voltage transistors.

Subsequently, after forming a photoresist pattern which covers regions for forming the MIS transistors requiring the suppression of the leakage currents in the peripheral circuit domain and the logic circuit domain and which denudes any other region, the parts of the gate insulating film denuded by the photoresist pattern are removed, and further, the photoresist pattern is removed.

Thereafter, the resulting semiconductor substrate 3 is subjected to an oxidizing treatment for forming the gate insulating film for the MIS transistors requiring a high-speed operation, whereby the gate insulating film which has a second thickness being relatively small and being, for example, about 4 nm is formed on the principal surface of the semiconductor substrate 3.

Figure 25:
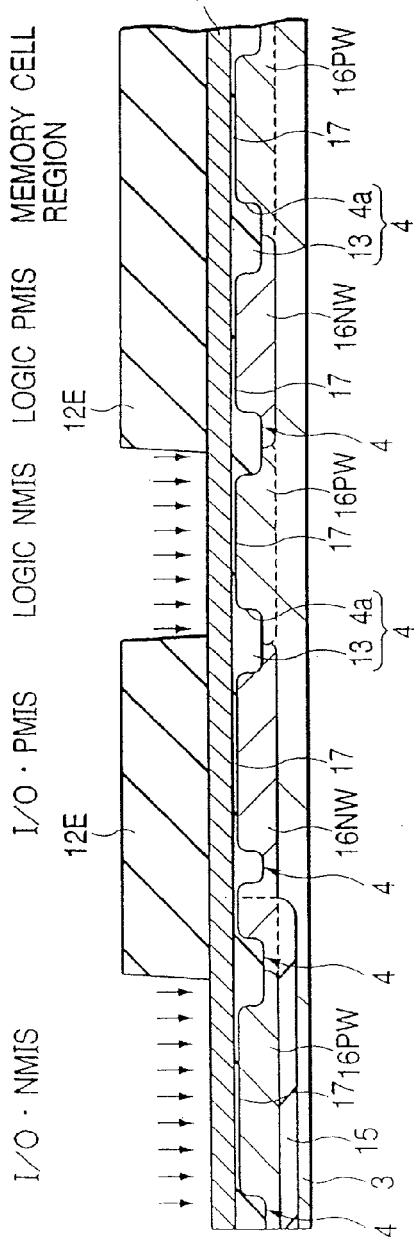
FIG. 25 is a vertical sectional view of the essential portions of the device during manufacturing steps subsequent to the process step in FIG. 24.

Subsequently, as shown in FIG. 25, a conductor film 18 for forming gate electrodes is formed on the resulting semiconductor substrate 3 by CVD or the like so as to cover the gate oxide film 17 formed as explained above and the upper surfaces of the isolation portions 4. The conductor film 18 is made of, for example, a simple substance film of lowresistance polysilicon, a stacked film in which a tungsten silicide film is deposited on low-resistance polysilicon; or a stacked film in which a metal film of tungsten or the like is deposited over lowresistance polysilicon through a barrier metal film of tungsten nitride, titanium nitride or the like. The conductor film 18 corresponds to the polysilicon layer PSi shown in FIG. 7. Incidentally, the barrier metal film functions in a high-temperature heat treatment as a barrier layer which prevents the tungsten film and the polysilicon film from reacting to form a silicide layer of high resistance at the interface between both the films.

Subsequently, as exemplified in FIG. 25, a photoresist pattern 12E which denudes regions for forming the MIS transistors of n-channel type, except the memory cell domain, and which covers any other region is formed on the conductor film 18, whereupon an n-type impurity, for example, phosphorus is ionimplanted into the conductor film 18 by employing the photoresist pattern 12E as a mask. Thereafter, the photoresist pattern 12E is removed. Thus, the n-type impurity is introduced into the gate electrode forming regions of the n-channel type MIS transistors which are to be formed in the regions except the memory cell domain.

Figure 26:
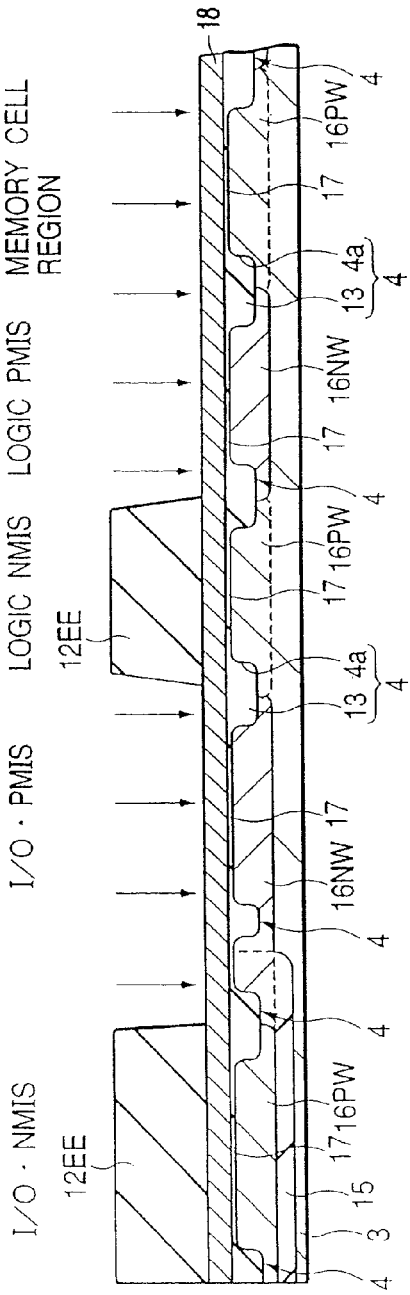
FIG. 26 is a vertical sectional view of the essential portions of the device during manufacturing steps subsequent to the process step in FIG. 25.

After removing the photoresist pattern 12E, a photoresist pattern 12EE which denudes regions for forming the MIS transistors of p-channel type, together with the memory cell domain, and which covers any other region is formed on the conductor film 18 as exemplified in FIG. 26 at this time, whereupon a ptype impurity, for example, boron (B) is ion-implanted into the conductor film 18 by employing the photoresist pattern 12EE as a mask. Thereafter, the photoresist pattern 12EE is removed. Thus, the p-type impurity is introduced into the gate electrode forming regions of the p-channel type MIS transistors and the n-channel type MIS transistor of the memory cell domain. Via this step, the floating gate FGT of the nonvolatile memory element 130 can contain the p-type impurity, whereby the threshold voltage Vth of the nonvolatile memory element is readily set at the middle threshold voltage between the high threshold state and the low threshold state. In a case where the initial threshold voltage is controlled by introducing a p-type impurity into the channel region of the pertinent MIS transistor MFSn, a photo-mask is prepared separately from one for controlling the threshold voltage of any other n-channel type MIS transistor.

Thereafter, the photoresist pattern 12EE is removed, whereupon an insulating film for capping, which is made of silicon oxide or silicon nitride by way of example, is deposited on the conductor film 18 by CVD or the like.

Figure 27:
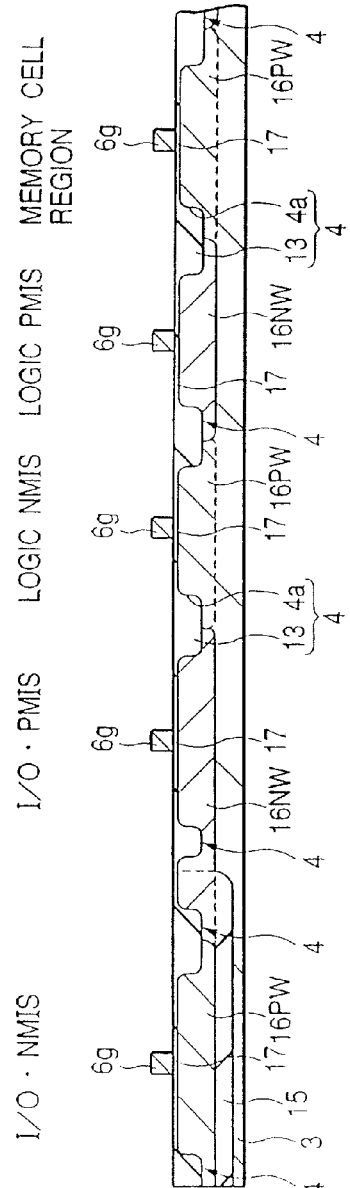
FIG. 27 is a vertical sectional view of the essential portions of the device during manufacturing steps subsequent to the process step in FIG. 26.

Subsequently, the insulating film for capping is patterned by dry etching or the like with a photoresist pattern used as a mask, followed by the removal of the photoresist pattern, and the conductor film 18 is patterned with the patterned capping insulating film used as a mask, followed by the removal of the capping insulating film 19, whereby the gate electrodes 6g are formed as shown in FIG. 27.

Figure 28:
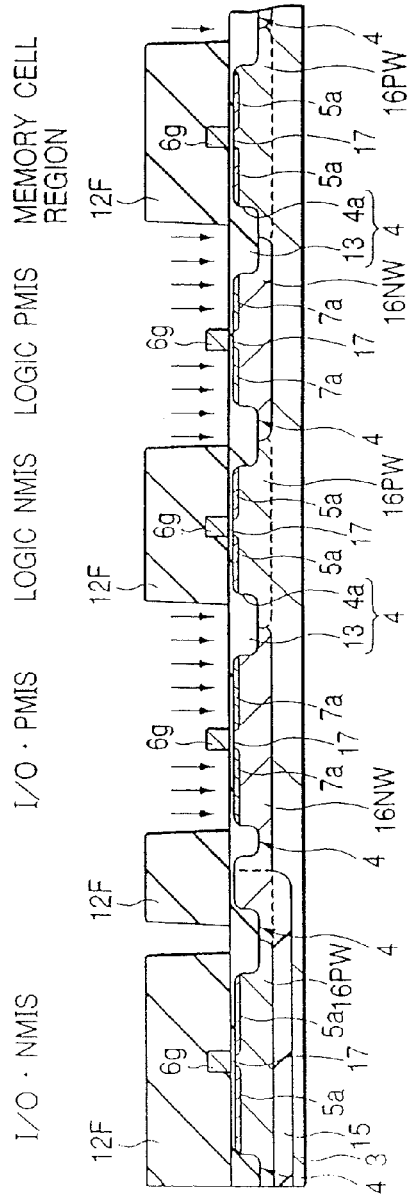
FIG. 28 is a vertical sectional view of the essential portions of the device during manufacturing steps subsequent to the process step in FIG. 27.

Subsequently, as shown in FIG. 28, boron (B), for example, is ion-implanted into the n-wells 16NW by employing a photoresist pattern 12F as a mask, thereby to form semiconductor regions 7a of p⁻-type in those parts of each of the n-wells 16NW which lie on both sides of the corresponding gate electrode 6g. Incidentally, at this stage, the p⁻-type semiconductor regions 7a are not formed yet because a heat treatment for activation etc. has not been carried out, but they are shown in the figure in order to facilitate the understanding of the description.

Next, after removing the photoresist pattern 12F, phosphorus (P), for example, is ion-implanted into the p-wells 16PW by employing as a mask a photoresist pattern formed anew and not shown, thereby to form semiconductor regions 5a of n⁻-type in those parts of each of the p-wells 16PW which lie on both the sides of the corresponding gate electrode 6g. Incidentally, at this stage, the n⁻-type semiconductor regions 5a are not formed yet because a heat treatment for activation etc. has not been carried out, but they are shown in the figure in order to facilitate the understanding of the description. Besides, in spite of this processing, the impurity already introduced in the gate of the n-channel type MIS transistor in the memory cell domain shall still maintain the p-type.

Figure 29:
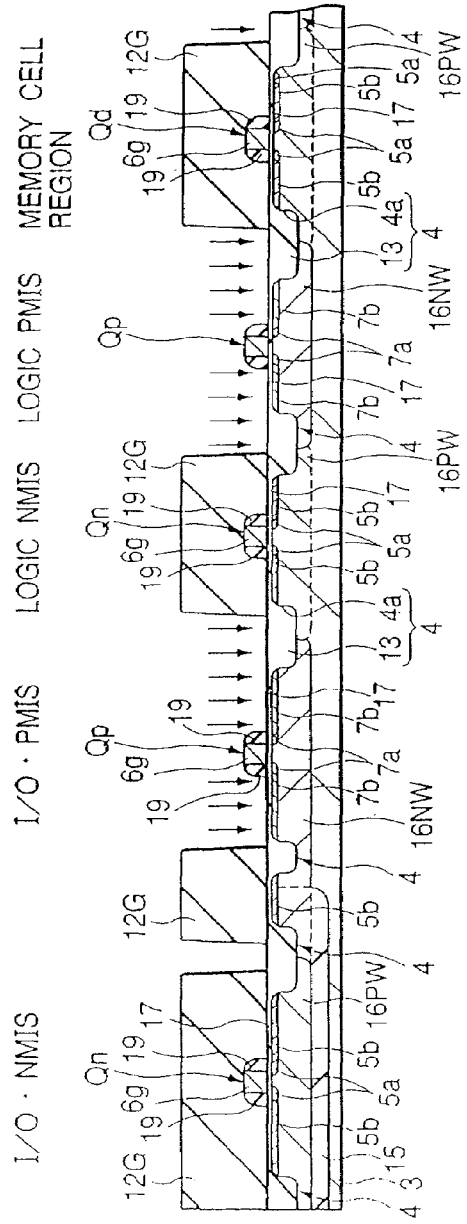
FIG. 29 is a vertical sectional view of the essential portions of the device during manufacturing steps subsequent to the process step in FIG. 28.

Subsequently, the photoresist pattern 12F is removed, followed by the heat treatment for the activation of the impurities introduced into the semiconductor substrate 3, etc. Thereafter, as shown in FIG. 29, a silicon nitride film being about 50 nm thick is deposited on the resulting semiconductor substrate 3 by CVD and is etched anisotropically, thereby to form sidewall spacers 19 on the sidewalls of each of the gate electrodes 6g. In order to minimize the amounts of scrapings of the gate insulating film 17 and the silicon oxide film buried in the isolation portions 4, this etching is carried out using an etching gas with which the etching rate of the silicon nitride film is large relative to those of the silicon oxide films. Also in a case where an insulating film for capping as is made of a silicon nitride film is formed on the gate electrodes 6g, the amount of overetching shall be confined to the required minimum in order to minimize the amount of scrapings of the capping insulating film.

Subsequently, arsenic (As), for example, is ion implanted into the p-wells 16PW by employing a photoresist pattern as a mask, thereby to form semiconductor regions 5b of n⁺-type for the n-channel type MIS transistors. Besides, in spite of this processing, the impurity already introduced in the gate of the n-channel type MIS transistor in the memory cell domain shall still maintain the p-type. Incidentally, at this stage, the n⁺-type semiconductor regions 5b are not formed yet because a heat treatment for activation etc. has not been carried out, but they are shown in the figure in order to facilitate the understanding of the description.

Next, after removing the photoresist pattern, boron (B), for example, is ion-implanted into the n-wells 16NW by employing as a mask a photoresist pattern 12G formed anew, thereby to form semiconductor regions 7b of p⁺-type for the p-channel MIS transistors. Incidentally, at this stage, the p⁺-type semiconductor regions 7b are not formed yet because a heat treatment for activation etc. has not been carried out, but they are shown in the figure in order to facilitate the understanding of the description.

Thereafter, the photoresist pattern 12G is removed, followed by subjecting the resulting semiconductor substrate 3 to the heat treatment for the activation of the impurities, whereby the MISFETs Qp, QL of the p-channel type and the MISFETs Qn, Qd of the n-channel type are formed.

Figure 30:
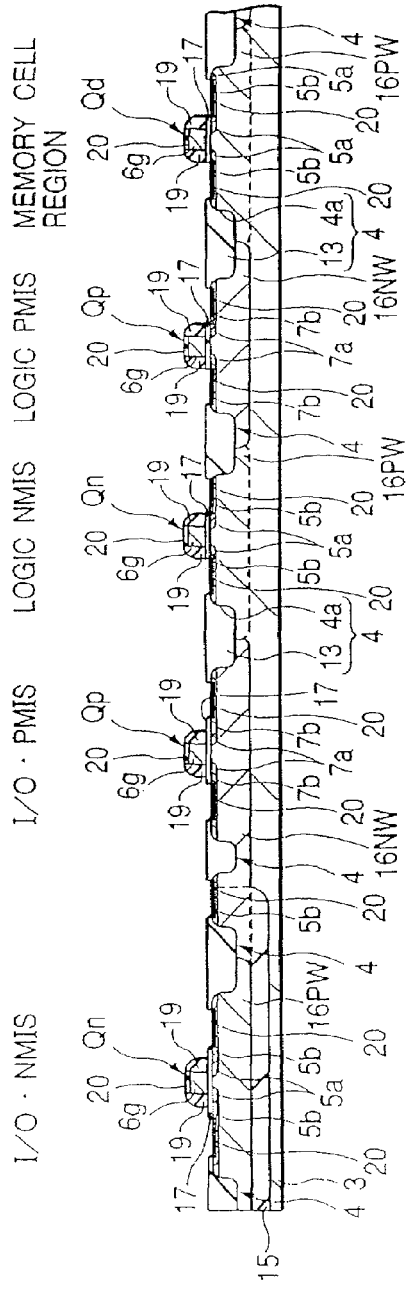
FIG. 30 is a vertical sectional view of the essential portions of the device during manufacturing steps subsequent to the process step in FIG. 29.

Subsequently, a conductor film of, for example, titanium nitride (TiN) or cobalt (Co) is deposited on the resulting semiconductor substrate 3 by sputtering or the like, followed by a heat treatment, whereby as shown in FIG. 30, a silicide layer 20 is formed at the contact interfaces between the conductor film and the semiconductor substrate 3 as well as the gate electrodes 6g. Next, the conductor film not silicified is etched and removed, whereupon a heat treatment is carried out again.

Subsequently, an insulating film 21a made of, for example, a silicon nitride film is deposited on the resulting semiconductor substrate 3 by CVD or the like, an insulating film 21b made of, for example, PSG (Phopho Silicate Glass) is thereafter deposited on the insulating film 21a by CVD or the like, and an insulating film 21c made of, for example, silicon oxide is further deposited on the insulating film 21b. Next, the upper surface of the insulating film 21c is flattened by CMP, whereupon contact holes 8 are provided in parts of the insulating films 21a to 21c. Thereafter, titanium, titanium nitride, and tungsten, for example, are deposited on the resulting semiconductor substrate 3 in succession from below and are etched back by CMP, whereby a conductor film 22 is buried and formed in the contact holes B.

Figure 31:
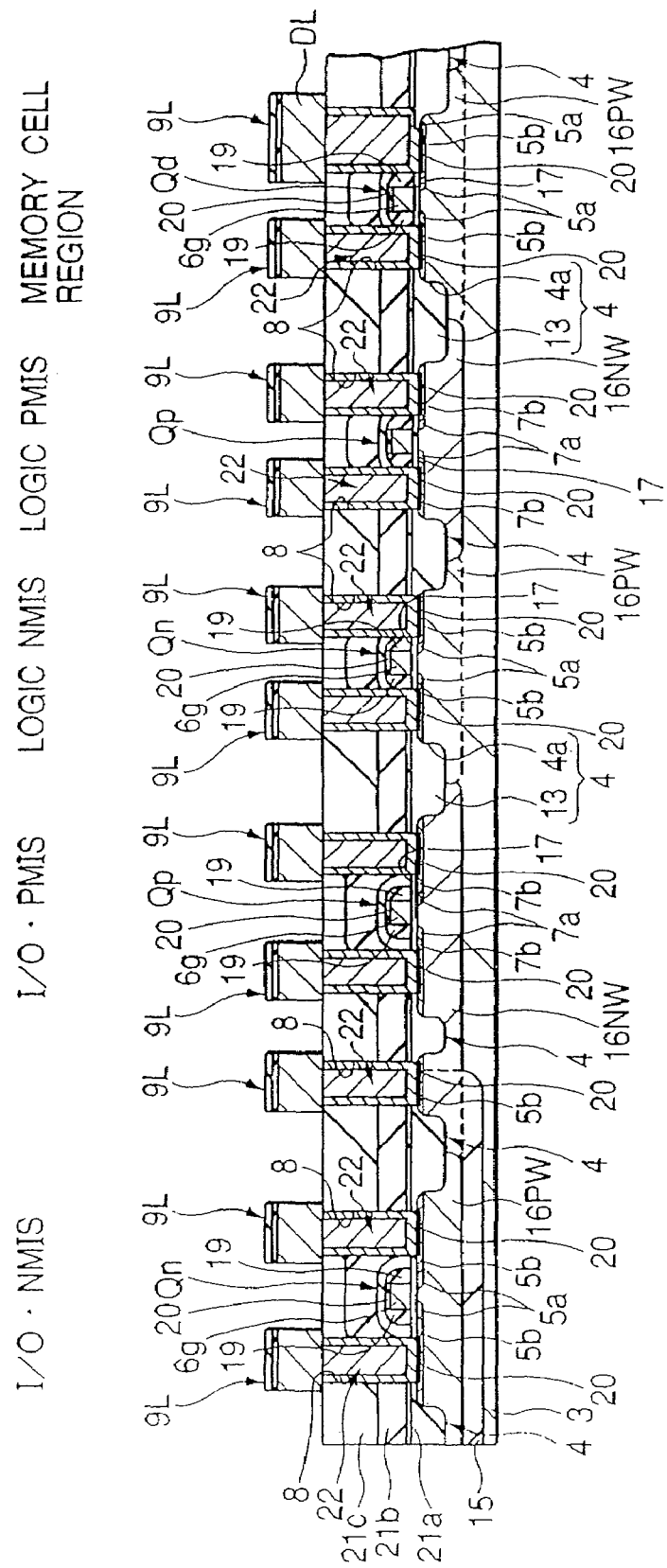
FIG. 31 is a vertical sectional view of the essential portions of the device during manufacturing steps subsequent to the process step in FIG. 30.
Figure 32:
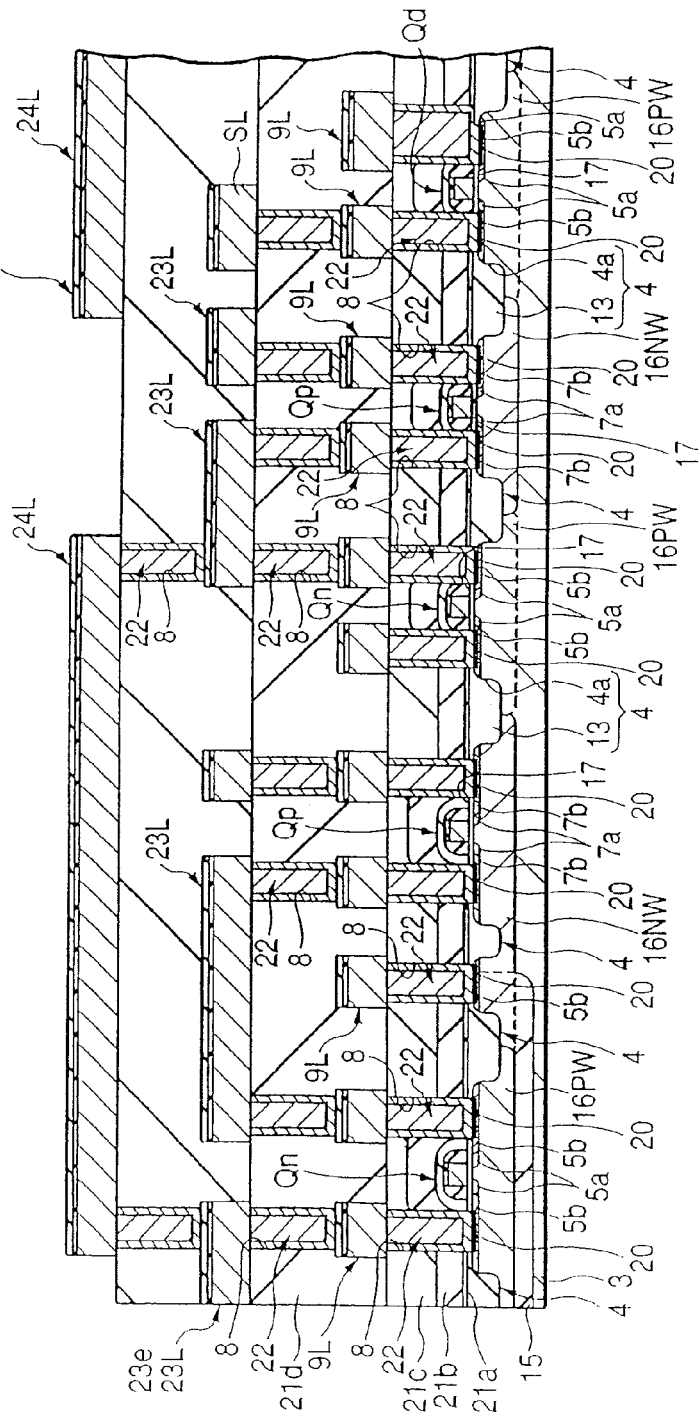
FIG. 32 is a vertical sectional view of the essential portions of the device during manufacturing steps subsequent to the process step in FIG. 31.

Subsequently, titanium, aluminum or an aluminum alloy, titanium, and titanium nitride, for example, are deposited on the resulting semiconductor substrate 3 in succession from below and are patterned by a photolithographic technique and a dry etching technique, thereby to form a first aluminum conductive layer (AL1) 9L as shown in FIG. 31. Next, as shown in FIG. 32, a second aluminum conductive layer (AL2) 23L and a third aluminum conductive layer (AL3) 24L are formed similarly to the first aluminum conductive layer (AL1) 9L. Incidentally, symbols 21d, 21e indicate insulating films made of, for example, silicon oxide.

In this manner, the two sorts of thicknesses are bestowed on the gate oxide films, and the CMOS process such as the single-layer polysilicon gate method is employed, whereby the nonvolatile memory elements 130 can be formed on the semiconductor substrate without adding any special process. Moreover, any special mask is not required for the step of introducing the p-type impurity into the floating gates of the MIS transistors for constructing the nonvolatile memory elements 130. It will be obvious from the foregoing that the flash memory which is in the differential form and which also has an excellent data retention capability can be readily obtained without adding any special manufacturing process or photomask. It is accordingly possible to manufacture the flash memory without adding any new process peculiar to the flash memory, to a complementary MIS transistor manufacturing process such as one called the "CMOS (Complementary Metal Oxide Semiconductor) process", and to merge and package the flash memory into a complementary MIS logic LSI or a complementary MIS-DRAM forming a basis, without increasing the cost of manufacture.

[Microcomputer]

Figure 33:
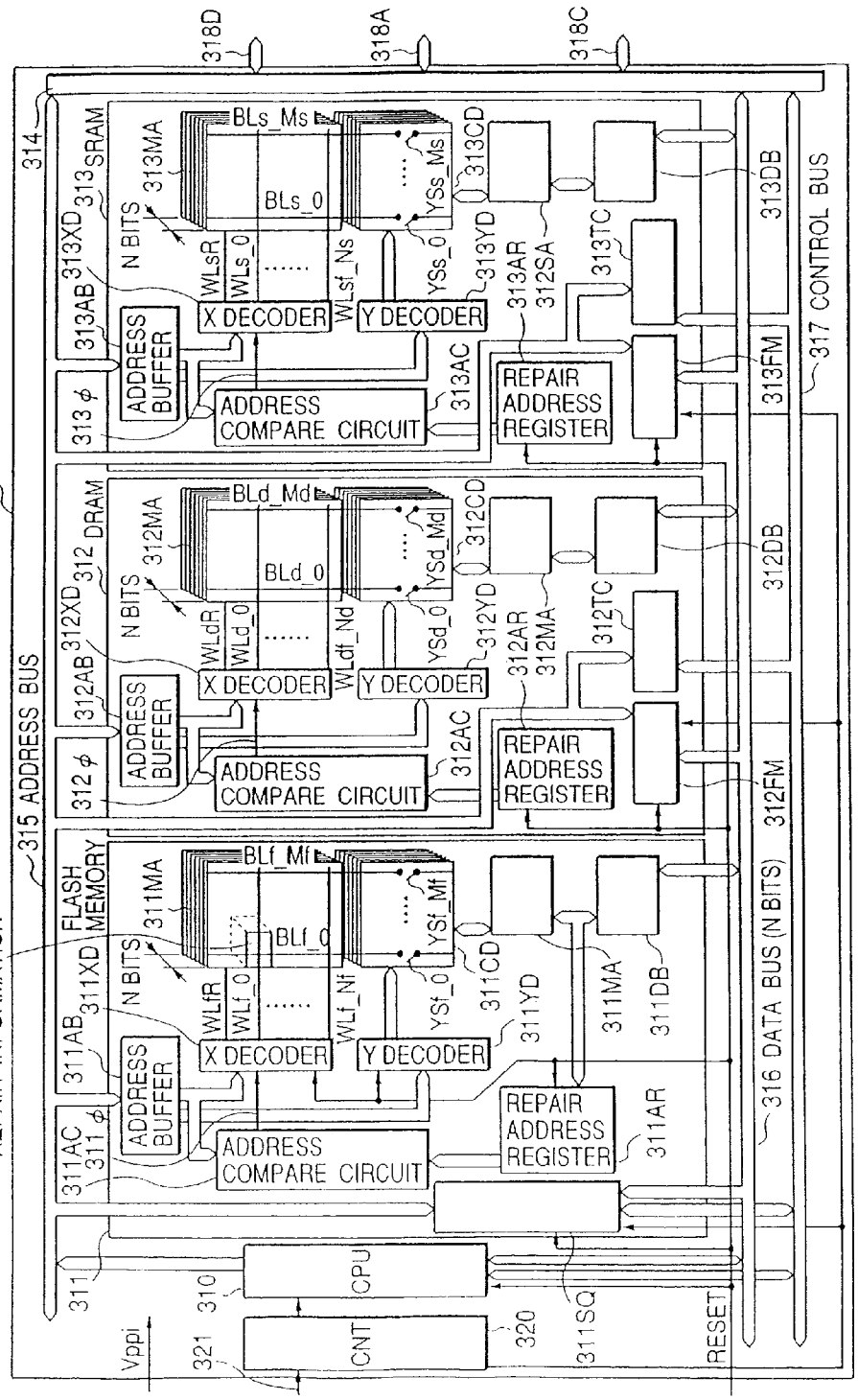
FIG. 33 is a block diagram of a microcomputer which represents a second example of the semiconductor integrated circuit according to the present invention.

FIG. 33 shows a microcomputer (or microprocessor) as a data processor which is the second example of the semiconductor integrated circuit according to the present invention. The microcomputer 301 can also be located as a system LSI in which a DRAM etc. are merged and packaged with a logic circuit. Also the microcomputer 301 has the two sorts of gate oxide film thicknesses explained before, and can be formed on one semiconductor substrate made of single-crystal silicon or the like, by employing the complementary MIS process of single-layer gates.

The microcomputer 301 includes a CPU (central processing unit) 310 as a control circuit typically indicated, a flash memory 311 being an example of a nonvolatile memory, a dynamic random access memory (DRAM) 312 being an example of a volatile memory, a static random access memory (SRAM) 313 being another example of a volatile memory, an input/output circuit 314, etc. The memories 311, 312 and 313 can be regarded as memory modules, respectively. The CPU 310, flash memory 311, DRAM 312, SRAM 313 and input/output circuit 314 share an address bus 315, a data bus 316 of N bits and a control bus 317. The DRAM 312 and SRAM 313 include respective flash memories 312FM and 313FM as nonvolatile memories in order to hold remedy information which will be explained later.

Although the invention is not especially restricted thereto, the input/output circuit 14 is connected to an external address bus 18A, an external data bus 18D, an external control bus 18C, etc., and it includes therein an unshown input/output port which is connected to the buses 18A, 18D, 18C, a bus controller which controls the starts of bus cycles for the external buses 18A, 18D, 18C, etc., an input/output peripheral circuit which is represented by a serial interface circuit, and so forth.

Although the invention is not especially restricted thereto, the CPU 310 has an execution unit and a control unit. The execution unit includes an arithmetic logic unit (ALU), a program counter (PC), a stack pointer (SP), and a edicated regiater such as status register (SR), as well as a group of general registers which are utilized as work areas. The control unit includes an instruction register to which program instructions supplied from program data or an operation system program stored in the flash memory 311 are inputted in succession, an instruction decoder which decodes the instructions stored in the instruction register and generates control signals for the execution unit, and so forth. The execution unit is coupled to the address bus 315, data bus 316 and control bus 317, and it controls the output of a selective address signal to the address bus 315, the output of a selective control signal to the control bus 317, and the input/output of data through the data bus 316. Accordingly, the CPU 310 controls the operation of the microcomputer 301 entirely in accordance with the program data or the operation system program stored in the flash memory 311.

The DRAM 312 is a read/write memory of comparatively large capacity which is utilized as the work memory or main memory of the CPU 310. This DRAM 312 has a large capacity of, for example, several gigabits in correspondence with the large scale integration of a system. The memory cell array 312MA of the DRAM 312 has a redundant word line WLdR in addition to normal word lines WLd_O to WLdf_Nd. The selection terminals of normal dynamic memory cells are coupled to the normal word lines WLd_O to WLdf_Nd, while the selection terminal of a redundant dynamic memory cell is coupled to the redundant word line WLdR. The data input/output terminals of the memory cells are coupled to bit lines BLD_O to BLd_Md. Although not specifically illustrated, the bit lines BLd_O to BLd_Md have a folded bit line structure in which they are folded back around the sense amplifiers. These bit lines BLd_O to BLd_Md are connected in common to a common data line 312CD through Y selectors YSd_O to YSd_Md. Incidentally, the dynamic memory cell includes a capacitance element which stores information therein, and a selection MIS transistor which has a source-drain path between one electrode of the capacitance element and the corresponding data line and whose gate electrode as the selection element is coupled to the corresponding word line.

One of the word lines WLd_O to WLdf_Nd and redundant word line WLDR is selected by an X decoder 312XD. One of the Y selectors YSd_O to YSd_Md is brought into its ON state by the decoded output of a Y decoder 312YD. It is to be understood in FIG. 33 that N sets, each consisting of the memory cell array 312MA and the Y selectors YSd_O to Ysd_Md, are disposed in a direction perpendicular to the sheet of the drawing. Consequently, when a selection operation based on the X decoder 312XD and the Y decoder 312YD is performed, data is inputted/outputted to/from the common data line 312CD in N-bit units. Write data is supplied from the data bus 316 to a data buffer 312 DB, and a main amplifier 312MA drives the bit lines through the common data line 312CD in accordance with the input data. In a data readout operation, readout data transmitted from the bit lines to the common data line 312CD is amplified by the main amplifier 312MA, and the amplified data is outputted from the data buffer 312 DB to the data bus 316.

Which of the normal word lines WLd_O to WLdf_Nd is replaced with the selection of the redundant word line WLdR, is determined by the remedy information stored in the flash memory 312FM. The remedy information stored in the flash memory 312FM is loaded into a remedy address register 312AR in synchronism with a reset operation which is based on the high level of a reset signal RESET used as a control signal for initialization. The remedy address register 312AR includes a static latch of a plurality of bits, and it latches the remedy information outputted from the flash memory 312FM and supplies the information to an address comparison circuit 312AC in response to the high level of the reset signal RESET.

When the loaded remedy information is valid, it is compared with a row address signal from the address buffer 312AB, by the address comparison circuit 312AC. When the result of the comparison is agreement, a detection signal 312φ is set at logical value "1", and the others are set at logical value "0". The X decoder 312XD and the Y decoder 312YD are supplied with the address signal of the address bus 315 through the address buffer 312AB, and they decode the supplied address signal. Especially the X decoder 312XD decodes the row address signal from the address buffer 312AB when the detection signal 12φ supplied from the address comparison circuit 312AC is the logical value "0" signifying disagreement, whereas it is inhibited from decoding the row address signal from the address buffer 312AB and selects the redundant word line WLdR instead when, the detection signal 312φ is the logical value "1" signifying the agreement. Thus, a memory access concerning a faulty word line is replaced with the operation of selecting a redundant memory cell concerning the redundant word line WLdR.

The internal timing control of the DRAM 312 is performed by a timing controller 312TC. The timing controller 312TC is supplied with strobe signals, such as a read signal and a write signal, through the control bus 317 from the CPU 310, and with an address signal of a plurality of bits regarded as a memory selection signal, from the address bus 315. When the selection of the operation of the DRAM 312 is detected by the timing controller 312TC, the circuits of the X decoder 312XD etc. are activated, so that when the readout operation is designated by the read signal, the stored information of the memory cell selected from within the memory cell array 312MA is outputted to the data bus 316 through the main amplifier 312MA as well as the data buffer 312DB, and that when the write operation is designated by the write signal, inputted data is written into the memory cell selected from within the memory cell array 312MA, through the data buffer 312DB as well as the main amplifier 312MA.

The SRAM 313 is utilized as a high-speed access memory, for example, a register file or data buffer memory or a cache memory. The memory cell array 313MA of the SRAM 313 has a redundant word line WLsR in addition to normal word lines WLs_O to WLsf_Ns. The selection terminals of normal static memory cells are coupled to the normial_word lines WLs_O to WLsf_Ns, while the selection terminal of a redundant static memory cell is coupled to the redundant word line WLsR. The data input/output terminals of the static memory cells are coupled to complementary bit lines BLs_O to BLs_Ms. The static memory cell includes a flip-flop which stores information therein, and a pair of selection MIS transistors whose source-drain paths are coupled between one pair of input/output nodes of the flip-flop and the corresponding pair of complementary bit lines and whose gate electrodes as the selection terminals are coupled to the corresponding word line. The complementary bit lines BLs_O to BLs_Ms are connected in common to a common data line 313CD through Y selectors YSs_O to YSs_Ms. One of the word lines WLs_O to WLsf_Ns and redundant word line WLsR is selected by an X decoder 313XD. One of the Y selectors YSs_O to YSs_Ms is brought into its ON state by the decoded output of a Y decoder 313YD. It is to be understood that N sets, each consisting of the memory cell array 313MA and the Y selectors YSs_O to YSs_Ms, are disposed in a direction perpendicular to the sheet of the drawing. Consequently, when a selection operation based on the X decoder 313XD and the Y decoder 313YD is performed, data is inputted/outputted to/from the common data line 313CD in N-bit units. Write data is supplied from the data bus 316 to a data buffer 313DB, and a sense amplifier 313SA drives the bit lines through the common data line 313CD in accordance with the input data. In a data readout operation, readout data transmitted from the bit lines to the common data line 313CD is amplified by the main amplifier 313SA, and the amplified data is outputted from the data buffer 313DB to the data bus 316.

Which of the normal word lines WLs_O to WLsf_Ns is replaced with the selection of the redundant word line WLsR, is determined in accordance with the remedy information stored in the flash memory 313FM. The remedy information stored in the flash memory 313FM is loaded into a remedy address register 313AR in synchronism with the reset operation which is based on the high level of the reset signal RESET. The remedy address register 313AR includes a static latch of a plurality of bits, and it latches the remedy information outputted from the flash memory 313FM and supplies the information to an address comparison circuit 313AC in response to the high level of the reset signal RESET.

When the loaded remedy information is valid, it is compared with a row address signal from the address buffer 313AB, by the address comparison circuit 313AC. When the result of the comparison is agreement, a detection signal 313φ is set at logical value "1", and the others are set at logical value "0". The X decoder 313XD and the Y decoder 313YD are supplied with the address signal of the address bus 315 through the address buffer 313AB, and they decode the supplied address signal. Especially the X decoder 313XD decodes the row address signal from the address buffer 313AB when the detection signal 313φ supplied from the address comparison circuit 313AC is the logical value "0" signifying disagreement, whereas it is inhibited from decoding the row address signal from the address buffer 312AB and selects the redundant word line WLsR instead when the detection signal 313φ is the logical value "1" signifying agreement. Thus, a memory access concerning a faulty word line is replaced with the operation of selecting a redundant memory cell concerning the redundant word line WLsR.

The internal timing control of the SRAM 313 is performed by a timing controller 313TC. The timing controller 313TC is supplied with strobe signals, such as a read signal and a write signal, through the control bus 317 from the CPU 310, and with an address signal of a plurality of bits regarded as a memory selection signal, from the address bus 315. When the selection of the operation of the SRAM 313 is detected by the timing controller 313TC, the circuits of the X decoder 313XD etc. are activated, so that when the readout operation is designated by the read signal, the stored information of the memory cell selected from within the memory cell array 313MA is outputted to the data bus 316 through the sense amplifier 313SA as well as the data buffer 313DB, and that when the write operation is designated by the write signal, inputted data is written into the memory cell selected from within the memory cell array 313MA, through the data buffer 313DB.

The flash memory 311 includes a memory cell array 311MA in which electrically programmable nonvolatile memory cells each having a control gate and a floating gate are arranged in the shape of a matrix. Here, the nonvolatile memory cell has the construction explained with reference to FIGS. 6 and 7, in which the nonvolatile memory elements 130 formed having the single-layer polysilicon gates are connected in the differential form.

The memory cell array 311MA is used as an area for storing the operation programs of the CPU 310, etc. This memory cell array 311MA has a redundant word line WLfR in addition to normal word lines WLf_O to WLf_Nf. The control gates of normal nonvolatile memory cells are coupled to the normal word lines WLf_O to WLf_Nf, while the control gate of a redundant nonvolatile memory cell is coupled to the redundant word line WLFR. Bit lines BLf_O to BLf_Mf are coupled to the drains of the normal and redundant nonvolatile memory cells. Each of the word lines WLf_O to WLf_Nf corresponds to the word line WL exemplified in FIG. 6, while each of the bit lines BLf_O to BLf_Mf corresponds to the pair of complementary data lines DLt, DLb exemplified in FIG. 6. In FIG. 33, the source line is omitted from illustration. The sense amplifiers 143 explained with reference to FIG. 8 are disposed in correspondence with the bit lines BLf_O to BLf_Mf, but they are omitted from illustration in FIG. 33.

The bit lines BLf_O to BLf_Mf are connected in common to a common data line 311CD through Y selectors YSf_O to YSf_Mf. The common data line 311CD corresponds to the pair of complementary common data lines CDt, CDb explained with reference to FIG. 8.

One of the word lines WLf_O to WLf_Nf and redundant word line WLFR is selected by an X decoder 311XD. One of the Y selectors YSf_O to YSf_Mf is brought into its ON state by the decoded output of a Y decoder 311YD. It is to be understood that N sets, each consisting of the memory cell array 311MA and the Y selectors YSf_O to YSf_Mf, are disposed in a direction perpendicular to the sheet of the drawing. Consequently, when a selection operation based on the X decoder 311XD and the Y decoder 311YD is performed, data is allowed to be inputted/outputted in N-bit units between the memory cell and the common data line 311CD. Write data is supplied from the data bus 316 to a data buffer 311DB, and a main amplifier 311MA drives the common data line 311CD in accordance with the input data, whereby the bit line is driven through the sense amplifier not shown. In a data readout operation, a signal read out of the bit line is differentially amplified by the sense amplifier (not shown), the resulting signal is transmitted to the common data line 311CD and is amplified by the main amplifier 311MA, and the amplified signal is outputted from the data buffer 311DB to the data bus 316.

Which of the normal word lines WLf_0 to WLf_Nf is replaced with the selection of the redundant word line WLFR, is determined by the remedy information. The remedy information is held by the nonvolatile memory call which is coupled to the word line WLf_0 and the bit line BLf_0. The remedy information stored in the memory array 311MA is loaded into a remedy address register 311AR in synchronism with the reset operation which is based on the high level of the reset signal RESET. More specifically, a sequence controller 311SQ activates the sense amplifier (not shown) and the main amplifier 311MA so as to be capable of carrying out the read operation, in response to the designation of the reset operation based on the reset signal RESET. Besides, the X decoder 311XD and the Y decoder 31IYD select the word line WLf_0 and the bit line BLf_0 in response to a reset period designated by the reset signal RESET. Thus, the remedy information of N bits is outputted from the main amplifier 311MA. The remedy address register 311AR includes a static latch of a plurality of bits, and it latches the remedy information outputted from the main amplifier 311MA and supplies the information to an address comparison circuit 311AC in response to the high level of the reset signal RESET.

The address comparison circuit 311AC compares remedy row address information contained in the remedy information and the row address signal from an address buffer 311AB. When the result of the comparison is agreement, the address comparison circuit 311AC gives the X decoder 311XD a detection signal 311φ of logical value "1". When the detection signal 311φ is the logical value "1", the X decoder 311XD inhibits the word line selection operation based on the row address from the address buffer 311AB and selects the redundant word line WLFR instead. Thus, a memory access concerning a faulty word line is replaced with the operation of selecting a redundant memory cell concerning the redundant word line WLFR.

The timing controls of the erase, write and readout operations of the flash memory 311, etc. are performed by the sequence controller 311SQ. The sequence controller 311SQ is supplied with strobe signals, such as a read signal and a write signal, through the control bus 317 from the CPU 310, and with a command through the data bus, and it is also supplied with an address signal of a plurality of bits regarded as a memory selection signal, from the address bus 315.

The construction of the flash memory 311 has been described chiefly in connection with the structures for redundancy and remedy. It is to be understood that the construction, except for the remedying structure of the redundant word line WLFR, address comparison circuit 311AC, remedy address register 311AR, etc. is substantially the same as the construction of the flash memory explained with reference to FIG. 8. Besides, the flash memory 312FM built in the DRAM 312 and the flash memory 313FM built in the SRAM 313, basically have substantially the same memory cell arrangement as that of the flash memory explained with reference to FIG. 8. The point of difference from FIG. 8 is the construction in which, like the flash memory 311, the flash memories 312FM, 313FM deliver the remedy information to the remedy address registers 312AR, 313AR in response to the reset signal RESET, and the point of difference from FIG. 33 is that they do not have the remedying redundant structure.

The CPU 310 performs a series of data processing operations stated in a program, by executing such arithmetic processing that an instruction stored in, e.g., the flash memory 311 is fetched and decoded, that operands necessary for the execution of the instruction are derived from, e.g., the DRAM 312 or the SRAM 313 in accordance with the result of the decoding, that the derived operands are processed, and that the result of the processing is stored in the DRAM 312 or the SRAM 313 again. When the reset signal RESET is brought to its high level, the CPU 310 interrupts any processing under execution and initializes the required node of its internal circuit into a predetermined logical state. In the reset period (the period of the high level of the reset signal RESET), not only the interior of the CPU 310, but also the internal registers of unshown peripheral circuits are initialized. Further, as explained before, the process of initially loading the remedy information into the remedy address registers 311AR, 312AR, 313AR is performed in the flash memory 311, DRAM 312, SRAM 313. The reset signal RESET is changed to the high level in response to any command such as system reset or power-ON reset based on the turn-ON of an operating power source. When the reset signal RESET is negated to its low level, the CPU 10 starts reset exception processing. The internal initialization of the CPU 10 during the reset period is done for a program counter, a stack pointer, and controlling registers such as a status register. Besides, in the case of power-ON reset, the operation of a clock generator circuit is stabilized in a time period from the turn-ON of the power source till the release of the reset, so that a stable clock signal can be fed to the CPU 310 etc. after the release of the reset.

Indicated at qqiperal 320 in FIG. 33 is the mode control circuit (CNT) of the microcomputer 301. A control signal 321 forms a mode setting control signal of one bit or a plurality of bits for designating an operation mode (EPROM writer mode) in which the flash memories 311, 312FM, 313FM are allowed to be programmed by a write apparatus, such as an EPROM writer, connected outside the microcomputer 301. When the EPROM writer mode is set in the microcomputer 301, the function of the external input/output circuit 314 is altered so that the microcomputer 301 may have an external interface function apparently equivalent to a semiconductor integrated circuit (bus slave) of simple flash memory, and the operation of the CPU 310 is stopped. More specifically, the buffer circuits coupled to the address bus 315, data bus 316 and control bus 317 of the CPU 310 are brought into high impedance states in response to the setting of the EPROM writer mode, and the CPU 310 is electrically disconnected from the buses 315, 316 and 317. In the EPROM writer mode, the external input/output circuit 314 receives an address signal from outside and supplies the address signal to the address bus 315, it delivers the data of the data bus 316 to the outside in response to the command of the read operation based on the external read signal, and it receives data and supplies the data to the data bus 316 in response to the command of the write operation based on the external write signal. When the EPROM writer mode is not set, the flash memories 311, 312FM, 313FM are accessible under the control of the CPU 310.

In the EPROM writer mode, a plurality of sorts of high voltages Vppi necessary for the erase and write operations of the flash memories 311, 312FM, 313FM are fed from outside. Accordingly, the flash memories 311, 312FM, 313FM need not be furnished with respective boosting supply voltage circuits which, steps up a voltage to the high voltages necessary for the erase and write operations. Since the boosting supply voltage circuits requiring comparatively large occupation areas can be omitted, reduction in the size of a chip can be realized. Herein, after the microcomputer has been packaged on a circuit board, the flash memories cannot be programmed (on-board programming) under a software control based on the CPU 310. The omission of the boosting supply voltage circuits, however, forms no hindrance and contributes to the higher performance and higher density of the microcomputer in a case where the flash memory 311 is a program memory which is replaced by a mask ROM and which need not be programmed on a system, and where remedy information suffices to be written into the flash memories 312FM, 313FM at the stage of manufacture. By the way, in an intended use requiring on-board programming, the boosting circuits may well be built in the flash memories under the condition that the application of a single supply voltage from the outside suffices. Even with this contrivance, a storage capacity suffices with several tens to several hundred bytes in most cases, in each of the flash memories 312FM, 313FM dedicated to store the remedy information. When the boosting circuits are individually mounted in such flash memories, it is supposed that the boosting circuits will occupy an area larger than the area of the memory cell array. Therefore, a dedicated boosting circuit should desirably be included in the flash memory 311 of comparatively large storage capacity which is utilized for general purposes or which is utilized for programmable logic items. Further, in that case, the stepped-up voltages of the dedicated boosting circuit may well be applied to the erase and write operations of the flash memories 312FM, 313FM dedicated to store the remedy information.

The microcomputer in the shape of the system LSI dispenses with a fuse programming circuit for remedying defects, and it can omit an apparatus and a processing step for cutting fuses, thereby to curtail the testing cost.

Incidentally, the flash memories 312FM, 313FM are not restricted to the memory cells of the differential form as shown in FIGS. 6 and 7, but they may well employ electrically erasable and programmable nonvolatile memory cells of single-layer polysilicon gates.

[Cache Memory]

Figure 34:
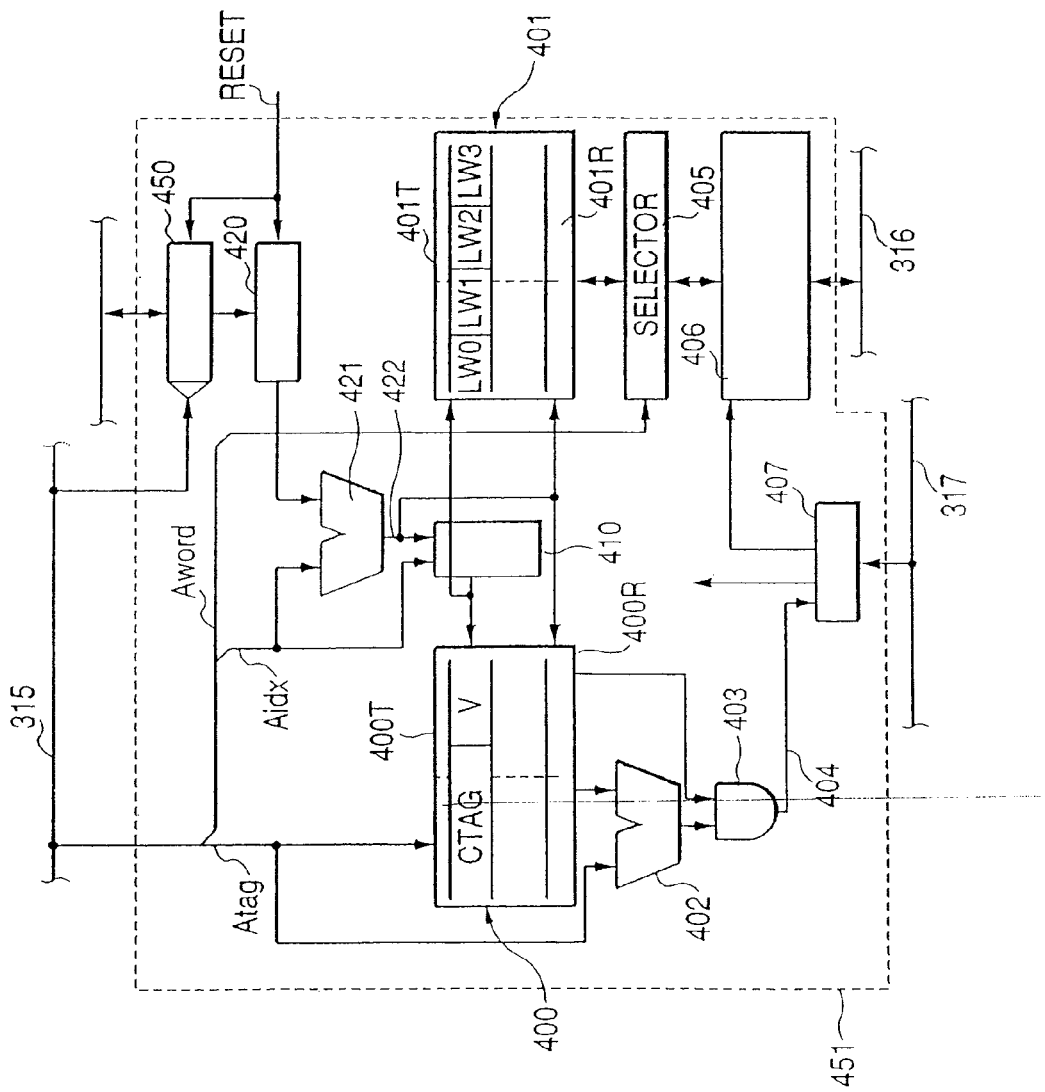
FIG. 34 is a block diagram showing a detailed example in the case where an SRAM in FIG. 33 is provided as a cache memory.

FIG. 34 shows a detailed example in the case where the SRAM 314 in FIG. 33 is provided as a cache memory. A flash memory 450 and the cache memory 451 shown in FIG. 34 are also applicable to the cache memory 108 and the flash memory 104 in FIG. 2.

Although the invention is not especially restricted thereto, the cache memory 451 is constructed as an associative memory of direct map form. Although the invention is not especially restricted thereto, the cache memory 451 includes a memory cell array which forms up to 256 cache lines, and which is configured of an address array 400 and a data array 401. The address array 400 and the data array 401 have normal arrays 400T, 401T in which normal static memory cells are arranged, and redundant arrays 400R, 401R in which remedying static memory cells to replace the faulty ones of the normal memory cells are arranged, respectively.

One cache line contains a cache tag (address tag) CTAG formed by physical page No., a validity bit V as well as an unshown dirty bit, data LW0 to LW3 of 16 bytes corresponding to each bit, and so forth. The cache tags CTAG, the validity bits and the unshown dirty bits are located in the address arrays 400T, 400R, while the data LW0 to LW3 are located in the data arrays 401T, 401R. The validity bit V indicates whether or not valid data is contained in the pertinent cache line, and it signifies "valid" with logical value "1" and "invalid" with logical value "0".

By way of example, an index address Aidx consisting of bit 4 to bit 11 of an address signal is used for selecting a cache entry. The index address Aidx is decoded by an address decoder 410, and the cache line is selected in the normal arrays 400T, 401T in accordance with the decoded result. Although the invention is not especially restricted thereto, each of the redundant arrays 400R, 401R has a storage capacity corresponding to one cache line, and they are selected when the comparison result signal 422 of a comparison circuit 412 indicates the state of agreement. When the comparison result signal 422 indicates agreement, the operation of selecting the normal array by the address decoder 410 is inhibited. The cache tag of the selected cache line is compared with a tag address Atag on the upper digit side of the corresponding address signal by a comparator 402. On condition that the cache tag CTAG and the tag address Atag agree and that the validity bit V is the logical value "1", a cache hit/miss signal 404 which is outputted from an AND gate 403 is brought to the logical value "1". On the other hand, cache line data of 32 bytes indexed by the data array 401 is selected by a selector 405 on the basis of a long word address Aword consisting of the lower digit side bits 2 and 3 of the address signal.

When the cache hit/miss signal 404 indicates the logical value "1" (cache read hit state) in a read access, a cache control circuit 407 controls an input/output circuit 406 so as to supply the data bus 316 with the long word data selected by the selector 405. In a case where the cache hit/miss signal 404 indicates the logical value "0" (cache read miss state) in the read access, data which corresponds to one cache line containing the data relevant to the miss is read from the data bus 316 so as to execute a cache fill operation. In a case where the cache hit/miss signal 404 indicates the logical value "1" (cache write hit state) in a write access, data is written into the hit entry and the dirty bit of the entry is set, subject to the cache operation mode being a copy-back mode. A mismatched state with the data of an external memory is known from the dirty bit in a set state. When the dirty cache entry is expelled out of the cache memory 451 by the cache fill operation, the data is written back into the external memory. In a write-through mode, data is written into the hit entry and is also written into the external memory. In a case where the cache hit/miss signal 404 indicates the logical-value "0" (cache write miss state) in the write access, the cache fill operation is performed, the dirty bit is set to update the tag address, and data is written into the filled cache line, subject to the copy-back mode. In the case of the write-through mode, data is written into only the external memory.

The cache fill operation is the operation of loading the data of the cache line from the external memory, and cache entry is replaced in order to write the loaded data into the cache line. On this occasion, in the presence of any invalid cache entry, it is replaced. In the absence of any invalid cache entry, the logic of, for example, LRU (Least Recently Used) is conformed to, and the cache entry recently used least is set as a subject for the replacement. The replace control is performed by the cache controller 407.

The remedy address of the cache line having a faulty memory cell is held in the flash memory 450. As in FIG. 33, the remedy information is loaded into a remedy address register 420 during the high level period of the reset signal RESET. The loaded remedy information is compared with the index address Aidx by the comparison circuit 421.

The cache memory dispenses with a fuse programming circuit for remedying defects, and it can omit an apparatus and a processing step for cutting fuses, thereby to curtail the testing cost. Incidentally, the flash memory 450 may employ the memory cells of the differential form as shown in FIGS. 6 and 7, and it may well employ electrically erasable and programmable nonvolatile memory cells of single-layer polysilicon gates.

Although various embodiments and features of the invention have been concretely described above on the basis of aspects of the performance thereof, it is needless to say that the present invention is not restricted thereto, but that it is variously alterable within a scope not departing from the purport thereof.

By way of example, the contrivance in which the word line selection voltage is substantially equalized to the initial threshold voltage of the nonvolatile memory elements is extensively applicable to nonvolatile memory cells in which nonvolatile memory elements are connected in the differential connection form, and it is not restricted to the nonvolatile memory elements of the single-layer polysilicon gate structure.

In addition, the MIS transistors constituting the nonvolatile memory elements explained with reference to FIG. 1 etc. are not restricted to the nchannel type, but they may well be of p-channel type. In this case, the conductivity types of the respective semiconductor regions constituting the nonvolatile memory elements 130 shown in FIG. 1 may be reversed to those in FIG. 1. In this case, it is possible by way of example to set voltage conditions for the erase of the nonvolatile memory elements at Vnw=3.3 V, Vd=open, Vs=−5 V and Vw=0 V, voltage conditions for the write at Vnw=3.3 V, Vd=0 V, Vs=4 V and Vw 5 V, and voltage conditions for readout at Vnw=3.3 V, Vd=0 V, Vs=1.8V and Vw=0 V.

Besides, the voltage of the input voltage range in which the sense amplifier is subjected to transient response operation is not restricted to 50 mV, but it can be somewhat changed in accordance with the circuit constants of the MIS transistors constituting the sense amplifier. Vnw, Vd and Vs indicate the n-type well potential, drain potential and source potential of the element FMS of the p-type, respectively. Vw indicates the potential of the ptype well used as the control gate CGT.

Besides, the floating gate of the nonvolatile memory element and the gates of the other MIS transistors are not restricted to the polysilicon gates, but they may well be stacked films in which polysilicon is combined with tungsten silicide or the like. Likewise, the metal wiring is not restricted to the aluminum wiring, but it may well be tungsten wiring, copper wiring, or any other stacked film wiring.

Besides, the threshold voltage states of the erase state and the write state may well be defined reverse to the foregoing. Moreover, the circuit modules which are merged and packaged in the semiconductor integrated circuit are not restricted to those in FIG. 2 and FIG. 33, and it is not excluded to merge and package any other circuit such as a direct memory access controller.

Further, the load of the remedy information from the flash memory into the register is not restricted to synchronism with the command of reset, but it may well respond to the command of an appropriate operation mode. Besides, redundant data lines may well be laid in order to remedy faulty bits. Also, the cache memory is not restricted to the direct map, but it may well be set-associative, full-associative or the like.

Advantages which are attained by typical ones of embodiments disclosed in the present application will be briefly explained.

The differential connection form of nonvolatile memory elements is adopted for the memory cell of a nonvolatile memory, and the initial threshold voltage and the readout word line selection voltage of the nonvolatile memory elements are set to be substantially equal within the range of a voltage width within which the sensitivity of a sense amplifier is high, so that even if one nonvolatile memory element has turned faulty due to the gradual fall of the threshold voltage of the nonvolatile memory element having a high threshold voltage or the gradual rise of the threshold voltage of the nonvolatile memory element having a low threshold voltage, the threshold voltage of the faulty memory element is confined in a state which is substantially equal to the word line selection voltage, and that the nonvolatile memory element is therefore in a transient state or intermediate state between its ON state and its OFF state, whereby its signal state transmitted to the sense amplifier through a data line brings this sense amplifier into the input state of the transient response operation. Accordingly, if the state of the other nonvolatile memory element is normal, there is the very high possibility that the stored information of a correct logical value before the deterioration will be obtained by the differential amplification action of the sense amplifier, whereby a long-term data retention capability is enhanced, and lowering in the rate of readout faults can be realized.

Especially in case of previously setting the initial threshold voltage at a voltage near the average value between the relatively low threshold voltage and the relatively high threshold voltage, it is possible to substantially equalize the probability of occurrence faults ascribable to the gradual fall of the high threshold voltage of the nonvolatile memory element and the probability of occurrence of faults ascribable to the gradual rise of the low threshold voltage of the nonvolatile memory element, whereby the retention capability for the stored information can be enhanced to the utmost.

For the purpose of controlling the threshold voltages, the impurity of first conductivity type is introduced into the floating gates of the nonvolatile memory elements which can be produced by the single-layer polysilicon gate process, whereby the initial threshold voltage and word line selection voltage of the nonvolatile memory elements are readily set at a voltage which is hear the middle level of the operating supply voltage of the sense amplifier.

The thickness of the gate oxide films in the nonvolatile memory elements of single-layer gate structure is made common with the thicknesses of the gate oxide films of the MIS transistors of other circuits, whereby the nonvolatile memory elements can be endowed with a somewhat long information retention capability while preferentially avoiding the complication of the process of manufacture of a semiconductor integrated circuit. In a case where a satisfactory information retention capability cannot be ensured in point of the gate oxide film thickness when equalizing the gate insulating film thickness of the nonvolatile memory elements to that of the MIS transistors of an external interface circuit as explained above, the information retention capability can be enhanced still more in such a way that the memory cell in which the nonvolatile memory elements are connected in the differential form is adopted, and that, as described before, the initial threshold voltage of the nonvolatile memory elements is determined in relation to the sensitivity of the sense amplifier and the word line selection voltage and also in relation to the high threshold voltage and low threshold voltage of the nonvolatile memory elements.

What is claimed is:

1. A semiconductor integrated circuit device on a semiconductor substrate, comprising:
   a plurality of word lines;
   a plurality of data lines; and
   a plurality of electrically programmable and erasable non-volatile memory cells coupled to the plurality of word lines and to the plurality of data lines so that each electrically programmable and erasable non-volatile memory cell is coupled to one of the word lines and to one of the data lines, each electrically programmable and erasable non-volatile memory cell comprising:
   a MIS transistor having a floating gate of a first level polycrystalline silicon layer, a source, and a drain coupled to the corresponding data line, and
   a control circuit to control programming and erasing of the electrically programmable and erasable non-volatile memory cells, said control circuit being comprised of a semiconductor region in the semiconductor substrate, the control circuit being coupled to the corresponding word line.

2. A semiconductor integrated circuit device according to claim 1, further comprising:
   a volatile memory coupled to receive data stored in at least one of the electrically programmable and erasable non-volatile memory cells.

3. A semiconductor integrated circuit device on a semiconductor substrate, comprising:
   a plurality of word lines;
   a plurality of data lines; and
   a plurality of electrically programmable and erasable non-volatile memory cells coupled to the plurality of word lines and to the plurality of data lines so that each electrically programmable and erasable non-volatile memory cell is coupled to one of the word lines and to one of the data lines, each electrically programmable and erasable non-volatile memory cell comprising a pair of memory elements each of which includes:
   a MIS transistor having a floating gate comprised of a first level polycrystalline silicon layer, a source, and a drain coupled to the corresponding data line, and
   a control circuit to control programming and erasing of the electrically programmable and erasable non-volatile memory cells, said control circuit being comprised of a semiconductor region in the semiconductor substrate, the control circuit being coupled to the corresponding word line.

4. A semiconductor integrated circuit device according to claim 3, further comprising:
   a volatile memory coupled to receive data stored in at least one of the electrically programmable and erasable non-volatile memory cells.

* * * * *